United States Patent
Lasiter et al.

(10) Patent No.: US 9,190,208 B2
(45) Date of Patent: *Nov. 17, 2015

(54) METAL-INSULATOR-METAL CAPACITORS ON GLASS SUBSTRATES

(71) Applicant: QUALCOMM MEMS Technologies, Inc., San Diego, CA (US)

(72) Inventors: Jon Bradley Lasiter, Stockton, CA (US); Ravindra V. Shenoy, Dublin, CA (US); Donald William Kidwell, Los Gatos, CA (US); Victor Louis Arockiaraj Pushparaj, Sunnyvale, CA (US); Kwan-yu Lai, San Jose, CA (US); Ana Rangelova Londergan, Santa Clara, CA (US)

(73) Assignee: QUALCOMM MEMS Technologies, Inc., San Diego, CA (US)

( * ) Notice: Subject to any disclaimer, the term of this patent is extended or adjusted under 35 U.S.C. 154(b) by 4 days.

This patent is subject to a terminal disclaimer.

(21) Appl. No.: 14/523,258

(22) Filed: Oct. 24, 2014

(65) Prior Publication Data

US 2015/0041189 A1 Feb. 12, 2015

Related U.S. Application Data

(63) Continuation of application No. 13/454,978, filed on Apr. 24, 2012, now Pat. No. 8,896,521.

(51) Int. Cl.
*G06F 3/044* (2006.01)
*H01G 4/06* (2006.01)
(Continued)

(52) U.S. Cl.
CPC .................. *H01G 4/06* (2013.01); *H01G 4/008* (2013.01); *H01G 4/30* (2013.01); *H01L 23/15* (2013.01);
(Continued)

(58) Field of Classification Search
CPC ......... G06F 3/044; G06F 3/0412; H01G 4/30; H01L 28/56
USPC .............................. 345/156, 204, 174; 427/79
See application file for complete search history.

(56) References Cited

U.S. PATENT DOCUMENTS

| 3,926,763 A | 12/1975 | Reisman |
| 6,246,440 B1 | 6/2001 | Okamoto et al. |

(Continued)

FOREIGN PATENT DOCUMENTS

| EP | 1895680 A2 | 3/2008 |
| EP | 1983781 A1 | 10/2008 |

(Continued)

OTHER PUBLICATIONS

US Office Action dated Mar. 13, 2014 issued in U.S. Appl. No. 13/454,978.

(Continued)

*Primary Examiner* — Ricardo L Osorio
(74) *Attorney, Agent, or Firm* — Weaver Austin Villeneuve & Sampson LLP

(57) ABSTRACT

This disclosure provides systems, methods, and apparatus for metal-insulator-metal capacitors on glass substrates. In one aspect, an apparatus may include a glass substrate, with the glass substrate defining at least one via in the glass substrate. A first electrode layer may be disposed over surfaces of the glass substrate, including surfaces of the at least one via. A dielectric layer may be disposed on the first electrode layer. A second electrode layer may be disposed on the dielectric layer, with the dielectric layer electrically isolating the first electrode layer from the second electrode layer.

28 Claims, 20 Drawing Sheets

(51) Int. Cl.
*H01L 23/498* (2006.01)
*H01L 27/12* (2006.01)
*H01L 49/02* (2006.01)
*H01L 23/15* (2006.01)
*H01G 4/008* (2006.01)
*H01G 4/30* (2006.01)
*H05K 1/03* (2006.01)
*H05K 1/11* (2006.01)
*H05K 1/18* (2006.01)
*G02B 26/00* (2006.01)
*H01L 23/00* (2006.01)

(52) U.S. Cl.
CPC .......... *H01L 23/49827* (2013.01); *H01L 27/12* (2013.01); *H01L 28/60* (2013.01); *H01L 28/90* (2013.01); *H05K 1/0306* (2013.01); *H05K 1/115* (2013.01); *H05K 1/182* (2013.01); *G02B 26/001* (2013.01); *H01L 24/13* (2013.01); *H01L 24/16* (2013.01); *H01L 2224/131* (2013.01); *H01L 2224/16225* (2013.01); *H01L 2924/10253* (2013.01); *H01L 2924/1461* (2013.01); *H01L 2924/15311* (2013.01); *Y10T 29/49124* (2015.01)

(56) References Cited

U.S. PATENT DOCUMENTS

| | | | |
|---|---|---|---|
| 6,303,423 | B1 | 10/2001 | Lin |
| 6,362,012 | B1 | 3/2002 | Chi et al. |
| 6,479,856 | B1* | 11/2002 | Kashihara .................... 257/310 |
| 6,528,366 | B1 | 3/2003 | Tu et al. |
| 6,767,788 | B2 | 7/2004 | Kim |
| 7,062,414 | B2 | 6/2006 | Waite et al. |
| 7,068,679 | B1 | 6/2006 | Brown et al. |
| 7,071,054 | B2 | 7/2006 | Park |
| 7,129,580 | B1 | 10/2006 | Londergan et al. |
| 7,135,086 | B2 | 11/2006 | Matsuoka |
| 7,429,510 | B2 | 9/2008 | Das et al. |
| 7,539,253 | B2 | 5/2009 | Li et al. |
| 7,561,632 | B1 | 7/2009 | Van Zelst et al. |
| 7,564,914 | B2 | 7/2009 | Hansen et al. |
| 7,751,493 | B2 | 7/2010 | Niu et al. |
| 7,822,128 | B2 | 10/2010 | Maltsev et al. |
| 8,096,147 | B2 | 1/2012 | Flemming et al. |
| 8,098,755 | B2 | 1/2012 | Kim et al. |
| 8,415,768 | B1 | 4/2013 | Golda et al. |
| 8,492,315 | B2 | 7/2013 | Flemming et al. |
| 8,553,796 | B2 | 10/2013 | Oyman et al. |
| 2002/0085336 | A1 | 7/2002 | Winer et al. |
| 2003/0076900 | A1 | 4/2003 | Magee et al. |
| 2003/0165615 | A1* | 9/2003 | Aaltonen et al. ............... 427/79 |
| 2004/0043629 | A1 | 3/2004 | Lee et al. |
| 2004/0081131 | A1 | 4/2004 | Walton et al. |
| 2006/0024880 | A1 | 2/2006 | Chui et al. |
| 2006/0024904 | A1 | 2/2006 | Wilson |
| 2006/0049524 | A1 | 3/2006 | Lin et al. |
| 2006/0203708 | A1 | 9/2006 | Sampath et al. |
| 2006/0222097 | A1 | 10/2006 | Gupta et al. |
| 2007/0014919 | A1* | 1/2007 | Hamalainen et al. ...... 427/248.1 |
| 2007/0110183 | A1 | 5/2007 | Nagatani et al. |
| 2007/0213013 | A1 | 9/2007 | Kim |
| 2007/0223402 | A1 | 9/2007 | Waxman |
| 2008/0212461 | A1 | 9/2008 | Pande et al. |
| 2008/0285524 | A1 | 11/2008 | Yokoyama |
| 2008/0311859 | A1 | 12/2008 | Ponnampalam et al. |
| 2008/0317156 | A1 | 12/2008 | Sivanesan et al. |
| 2009/0103666 | A1 | 4/2009 | Zhao et al. |
| 2009/0116581 | A1 | 5/2009 | Liau |
| 2009/0161298 | A1 | 6/2009 | Lee et al. |
| 2009/0236691 | A1 | 9/2009 | Dyer et al. |
| 2009/0245375 | A1 | 10/2009 | Liu |
| 2009/0274237 | A1 | 11/2009 | Zelst et al. |
| 2009/0289724 | A1 | 11/2009 | Hu et al. |
| 2010/0025095 | A1 | 2/2010 | Guo et al. |
| 2010/0046599 | A1 | 2/2010 | Kim et al. |
| 2010/0230787 | A1 | 9/2010 | Guiraud et al. |
| 2010/0232527 | A1 | 9/2010 | Li et al. |
| 2010/0272201 | A1 | 10/2010 | Nakao et al. |
| 2011/0149374 | A1 | 6/2011 | Lan et al. |
| 2011/0176581 | A1 | 7/2011 | Thomas et al. |
| 2011/0210420 | A1 | 9/2011 | Lin |
| 2011/0217657 | A1 | 9/2011 | Flemming et al. |
| 2011/0260329 | A1 | 10/2011 | Seo |
| 2011/0310870 | A1 | 12/2011 | Van et al. |
| 2012/0002742 | A1 | 1/2012 | Cheng |
| 2012/0045003 | A1 | 2/2012 | Li et al. |
| 2012/0051408 | A1 | 3/2012 | Van Zelst et al. |
| 2012/0082193 | A1 | 4/2012 | Van Zelst et al. |
| 2012/0106603 | A1 | 5/2012 | Kim et al. |
| 2012/0121003 | A1 | 5/2012 | Kleider et al. |
| 2013/0200323 | A1* | 8/2013 | Pham et al. .................. 257/4 |
| 2013/0200324 | A1* | 8/2013 | Pham et al. .................. 257/4 |
| 2013/0241939 | A1 | 9/2013 | Lasiter et al. |
| 2013/0278568 | A1 | 10/2013 | Lasiter et al. |
| 2014/0064221 | A1 | 3/2014 | Van Zelst et al. |
| 2014/0064396 | A1 | 3/2014 | Van Zelst et al. |

FOREIGN PATENT DOCUMENTS

| | | |
|---|---|---|
| EP | 2287892 | 2/2011 |
| EP | 2423947 A2 | 2/2012 |
| WO | WO2006102639 A1 | 9/2006 |
| WO | WO2010129550 A2 | 11/2010 |
| WO | WO2011090440 A1 | 7/2011 |
| WO | WO2011163247 A2 | 12/2011 |
| WO | WO2013138029 A1 | 9/2013 |
| WO | WO2013163065 A1 | 10/2013 |

OTHER PUBLICATIONS

US Notice of Allowance dated Jun. 24, 2014 issued in U.S. Appl. No. 13/454,978.
US Notice of Allowance dated Jul. 25, 2014 issued in U.S. Appl. No. 13/454,978.
US Notice of Allowance dated Sep. 17, 2014 issued in U.S. Appl. No. 13/454,978.
International Search Report and Written Opinion—PCT/US2013/026882—ISA/EPO—May 15, 2013.
International Second Written Opinion—PCT/US2013/026882—ISA/EPO—Mar. 27, 2014.
International Preliminary Report on Patentability—PCT/US2013/026882—ISA/EPO—Jun. 27, 2014.
International Search Report and Written Opinion—PCT/US2013/037542—ISA/EPO—Jul. 23, 2013.
International Search Report and Written Opinion—PCT/US2011/049198—ISA/EPO—Feb. 2, 2012.
Partial International Search Report—PCT/US2011/049198—ISA/EPO—Nov. 7, 2011.
Banerjee, P., et al., "Nanotubular metal-insulator-metal capacitor arrays for energy storage", *Nature Nanotechnology*, 4(5):292-296 (2009).
Sandell, et al., "Smooth beamforming and efficient beamforming weight computation," *Global Telecommunications Conference* [Online], 2007, pp. 4076-4080.
Sandell, Magnus et al., "Smooth Beamforming for OFDM", IEEE Transactions on Wirelss Commincations, Vol. 8, No. 3, pp. 1133-1138 (Mar. 2009)Sun, Xiantao et al.,"Enhanced IEEE 802.11n Quantized Feedback Beamforming With Power Allocation", University of Delaware, Cisco Systems, pp. 908-912 (2008).
Shen, Cong Shen et at.,"MIMO-OFDM Beamforming for Improved Channel Estimation", *IEEE Journal on Selected Areas in Communications*, 26(6):948-959 (Aug. 2008).
Sun, Xiantao et al.,"Enhanced IEEE 802.11n Quantized Feedback Beamforming With Power Allocation", *University of Delaware, Cisco Systems*, pp. 908-912 (2008).
US Notice of Allowance (Corrected Notice of Allowability) dated Oct. 23, 2014 issued in U.S. Appl. No. 13/454,978.

* cited by examiner

Common Voltages

| | $VC_{ADD\_H}$ | $VC_{HOLD\_H}$ | $VC_{REL}$ | $VC_{HOLD\_L}$ | $VC_{ADD\_L}$ |
|---|---|---|---|---|---|
| $VS_H$ | Stable | Stable | Relax | Stable | Actuate |
| $VS_L$ | Actuate | Stable | Relax | Stable | Stable |

Segment Voltages

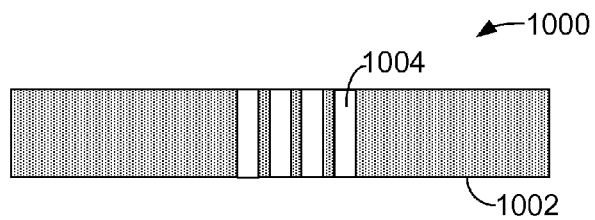
Figure 10A
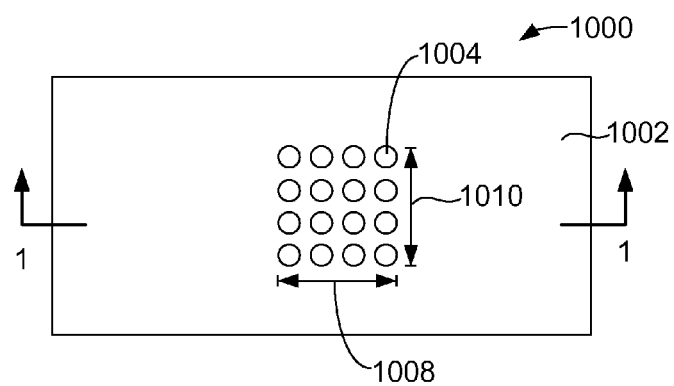
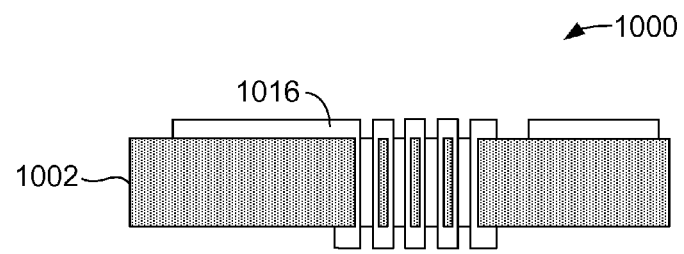
Figure 10B
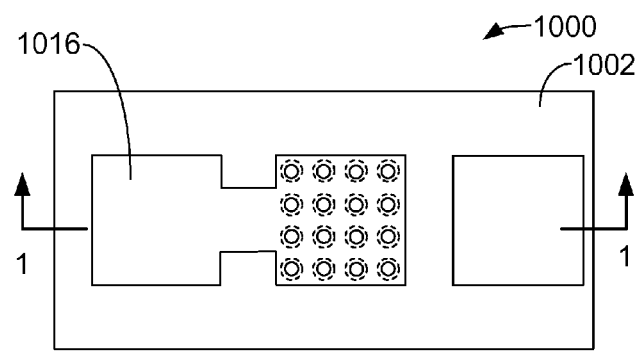

METAL-INSULATOR-METAL CAPACITORS ON GLASS SUBSTRATES

PRIORITY CLAIM

This application claims priority, and is a continuation of, U.S. patent application Ser. No. 13/454,978, filed Apr. 24, 2012 and entitled "METAL-INSULATOR-METAL CAPACITORS ON GLASS SUBSTRATES," which is hereby incorporated by reference in its entirety and for all purposes.

TECHNICAL FIELD

This disclosure relates generally to capacitor devices and more particularly to metal-insulator-metal capacitor devices on glass substrates.

DESCRIPTION OF THE RELATED TECHNOLOGY

Electromechanical systems (EMS) include devices having electrical and mechanical elements, actuators, transducers, sensors, optical components (including mirrors) and electronics. Electromechanical systems can be manufactured at a variety of scales including, but not limited to, microscales and nanoscales. For example, microelectromechanical systems (MEMS) devices can include structures having sizes ranging from about a micron to hundreds of microns or more. Nanoelectromechanical systems (NEMS) devices can include structures having sizes smaller than a micron including, for example, sizes smaller than several hundred nanometers. Electromechanical elements may be created using deposition, etching, lithography, and/or other micromachining processes that etch away parts of substrates and/or deposited material layers, or that add layers to form electrical and electromechanical devices.

One type of EMS device is called an interferometric modulator (IMOD). As used herein, the term interferometric modulator or interferometric light modulator refers to a device that selectively absorbs and/or reflects light using the principles of optical interference. In some implementations, an interferometric modulator may include a pair of conductive plates, one or both of which may be transparent and/or reflective, wholly or in part, and capable of relative motion upon application of an appropriate electrical signal. In an implementation, one plate may include a stationary layer deposited on a substrate and the other plate may include a reflective membrane separated from the stationary layer by an air gap. The position of one plate in relation to another can change the optical interference of light incident on the interferometric modulator. Interferometric modulator devices have a wide range of applications, and are anticipated to be used in improving existing products and creating new products, especially those with display capabilities.

Capacitor devices or capacitors may be used in implementations of EMS devices and/or associated with systems in which EMS devices are implemented. One type of capacitor device, for example, is a metal-insulator-metal (MIM) capacitor. With smaller capacitors, an increase in the capacitance density compared to larger capacitors may be used to supply the same capacitance as a larger capacitor.

SUMMARY

The systems, methods and devices of the disclosure each have several innovative aspects, no single one of which is solely responsible for the desirable attributes disclosed herein.

One innovative aspect of the subject matter described in this disclosure can be implemented in an apparatus including a glass substrate with the glass substrate defining at least one first via in the glass substrate. A first electrode layer may be disposed over surfaces of the glass substrate, including surfaces of the at least one first via. A dielectric layer may be disposed on the first electrode layer. A second electrode layer may be disposed on the dielectric layer. The dielectric layer may electrically isolate the first electrode layer from the second electrode layer.

In some implementations, a dielectric adhesion layer may be disposed on the surfaces of the glass substrate, including the surfaces of the at least one first via. The first electrode layer may be disposed on the dielectric adhesion layer. In some implementations, the dielectric adhesion layer may include an oxide. In some implementations, the glass substrate may be an interposer. At least one second through glass via defined in the glass substrate may include a conductive material configured to electrically connect a first electronic component to a second electronic component.

In some implementations, the apparatus may further include a second dielectric layer disposed on the second electrode layer and a third electrode layer disposed on the second dielectric layer. The second dielectric layer may electrically isolate the second electrode layer from the third electrode layer.

Another innovative aspect of the subject matter described in this disclosure can be implemented an apparatus including a glass substrate with the glass substrate defining at least one via in the glass substrate. A first electrode layer may be disposed over surfaces of the glass substrate, including surfaces of the at least one via. The apparatus may further include a second electrode layer and means for electrically isolating the first electrode layer from the second electrode layer.

In some implementations, the apparatus may further include means for improving the adhesion of the first electrode layer to the surfaces of the glass substrate. In some implementations, the glass substrate may further include means for electrically connecting a first electronic component to a second electronic component.

Another innovative aspect of the subject matter described in this disclosure can be implemented in a method including forming at least one via in a glass substrate. A first electrode layer may be deposited over surfaces of the glass substrate, including surfaces of the at least one via. A dielectric layer may be deposited on the first electrode layer. A second electrode layer may be deposited on the dielectric layer.

In some implementations, a dielectric adhesion layer may be deposited on the surfaces of the glass substrate, including the surfaces of the at least one via, with the first electrode layer being deposited on the dielectric adhesion layer. In some implementations, the dielectric adhesion layer may be deposited using an atomic layer deposition process. In some implementations, the method may further include forming at least one through glass via in the glass substrate. Forming the at least one via and the at least one through glass via may be performed substantially simultaneously.

Details of one or more implementations of the subject matter described in this specification are set forth in the accompanying drawings and the description below. Although the examples provided in this disclosure are primarily described in terms of electromechanical systems (EMS) and microelectromechanical systems (MEMS)-based displays, the concepts provided herein may apply to other types of displays, such as liquid crystal displays, organic light-emitting diode ("OLED") displays and field emission displays. Other features, aspects, and advantages will become apparent from the description, the drawings and the claims. Note that the relative dimensions of the following figures may not be drawn to scale.

BRIEF DESCRIPTION OF THE DRAWINGS

FIGS. 10A-10D show examples of schematic illustrations of a MIM capacitor at various stages in the manufacturing process.

Like reference numbers and designations in the various drawings indicate like elements.

DETAILED DESCRIPTION

Figure 1:
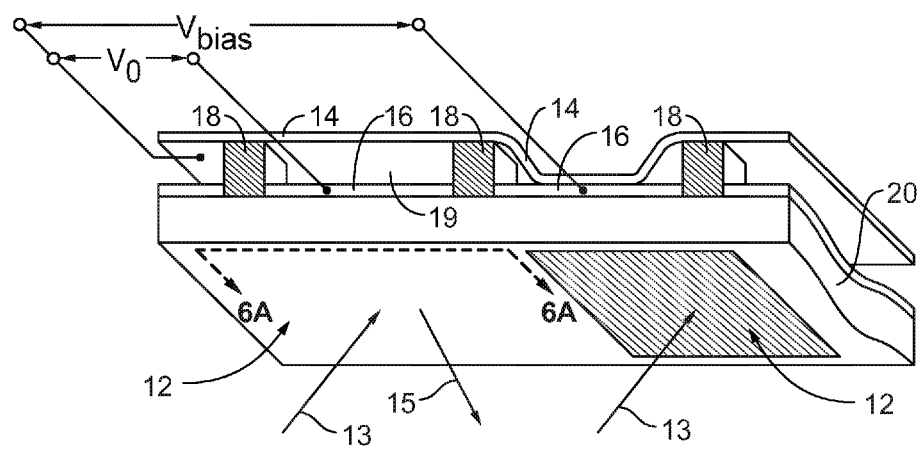
FIG. 1 shows an example of an isometric view depicting two adjacent pixels in a series of pixels of an interferometric modulator (IMOD) display device.

The following description is directed to certain implementations for the purposes of describing the innovative aspects of this disclosure. However, a person having ordinary skill in the art will readily recognize that the teachings herein can be applied in a multitude of different ways. The described implementations may be implemented in any device or system that can be configured to display an image, whether in motion (e.g., video) or stationary (e.g., still image), and whether textual, graphical or pictorial. More particularly, it is contemplated that the described implementations may be included in or associated with a variety of electronic devices such as, but not limited to: mobile telephones, multimedia Internet enabled cellular telephones, mobile television receivers, wireless devices, smartphones, Bluetooth® devices, personal data assistants (PDAs), wireless electronic mail receivers, hand-held or portable computers, netbooks, notebooks, smartbooks, tablets, printers, copiers, scanners, facsimile devices, GPS receivers/navigators, cameras, MP3 players, camcorders, game consoles, wrist watches, clocks, calculators, television monitors, flat panel displays, electronic reading devices (i.e., e-readers), computer monitors, auto displays (including odometer and speedometer displays, etc.), cockpit controls and/or displays, camera view displays (such as the display of a rear view camera in a vehicle), electronic photographs, electronic billboards or signs, projectors, architectural structures, microwaves, refrigerators, stereo systems, cassette recorders or players, DVD players, CD players, VCRs, radios, portable memory chips, washers, dryers, washer/dryers, parking meters, packaging (such as in electromechanical systems (EMS), microelectromechanical systems (MEMS) and non-MEMS applications), aesthetic structures (e.g., display of images on a piece of jewelry) and a variety of EMS devices. The teachings herein also can be used in non-display applications such as, but not limited to, electronic switching devices, radio frequency filters, sensors, accelerometers, gyroscopes, motion-sensing devices, magnetometers, inertial components for consumer electronics, parts of consumer electronics products, varactors, liquid crystal devices, electrophoretic devices, drive schemes, manufacturing processes and electronic test equipment. Thus, the teachings are not intended to be limited to the implementations depicted solely in the Figures, but instead have wide applicability as will be readily apparent to one having ordinary skill in the art.

Some implementations described herein relate to metal-insulator-metal (MIM) capacitors. In some implementations, a MIM capacitor may include two metal layers separated by a dielectric layer, all of which are disposed on a glass substrate. For example, one method of making a MIM capacitor may include defining at least one via in a glass substrate. A first electrode layer may be disposed over surfaces of the glass substrate, including surfaces of the at least one via. A dielectric layer may be disposed on the first electrode layer. A second electrode layer may be disposed on the dielectric layer, with the dielectric layer electrically isolating the first electrode layer from the second electrode layer.

Particular implementations of the subject matter described in this disclosure can be implemented to realize one or more of the following potential advantages. In some implementations, a glass substrate may be less expensive than other substrates, such as silicon, for example. It also may be less expensive to perform processing on glass compared to other substrates, such as silicon, for example. In some implementations, a glass substrate on which a MIM capacitor is disposed may function as an interposer. With the MIM capacitor disposed on the glass substrate functioning as an interposer, the distance of the MIM capacitor from electronic components (e.g., an integrated circuit and a printed circuit board) that the interposer is interconnecting may be reduced, which may reduce the signal to noise ratio.

An example of a suitable EMS or MEMS device, to which the described implementations may apply, is a reflective display device. Reflective display devices can incorporate interferometric modulators (IMODs) to selectively absorb and/or reflect light incident thereon using principles of optical interference. IMODs can include an absorber, a reflector that is movable with respect to the absorber, and an optical resonant cavity defined between the absorber and the reflector. The reflector can be moved to two or more different positions, which can change the size of the optical resonant cavity and thereby affect the reflectance of the interferometric modulator. The reflectance spectrums of IMODs can create fairly broad spectral bands which can be shifted across the visible wavelengths to generate different colors. The position of the spectral band can be adjusted by changing the thickness of the optical resonant cavity, i.e., by changing the position of the reflector.

FIG. 1 shows an example of an isometric view depicting two adjacent pixels in a series of pixels of an interferometric modulator (IMOD) display device. The IMOD display device includes one or more interferometric MEMS display elements. In these devices, the pixels of the MEMS display elements can be in either a bright or dark state. In the bright ("relaxed," "open" or "on") state, the display element reflects a large portion of incident visible light, e.g., to a user. Conversely, in the dark ("actuated," "closed" or "off") state, the display element reflects little incident visible light. In some implementations, the light reflectance properties of the on and off states may be reversed. MEMS pixels can be configured to reflect predominantly at particular wavelengths allowing for a color display in addition to black and white.

The IMOD display device can include a row/column array of IMODs. Each IMOD can include a pair of reflective layers, i.e., a movable reflective layer and a fixed partially reflective layer, positioned at a variable and controllable distance from each other to form an air gap (also referred to as an optical gap or cavity). The movable reflective layer may be moved between at least two positions. In a first position, i.e., a relaxed position, the movable reflective layer can be positioned at a relatively large distance from the fixed partially reflective layer. In a second position, i.e., an actuated position, the movable reflective layer can be positioned more closely to the partially reflective layer. Incident light that reflects from the two layers can interfere constructively or destructively depending on the position of the movable reflective layer, producing either an overall reflective or non-reflective state for each pixel. In some implementations, the IMOD may be in a reflective state when unactuated, reflecting light within the visible spectrum, and may be in a dark state when unactuated, reflecting light outside of the visible range (e.g., infrared light). In some other implementations, however, an IMOD may be in a dark state when unactuated, and in a reflective state when actuated. In some implementations, the introduction of an applied voltage can drive the pixels to change states. In some other implementations, an applied charge can drive the pixels to change states.

The depicted portion of the pixel array in FIG. 1 includes two adjacent interferometric modulators 12. In the IMOD 12 on the left (as illustrated), a movable reflective layer 14 is illustrated in a relaxed position at a predetermined distance from an optical stack 16, which includes a partially reflective layer. The voltage $V_0$ applied across the IMOD 12 on the left is insufficient to cause actuation of the movable reflective layer 14. In the IMOD 12 on the right, the movable reflective layer 14 is illustrated in an actuated position near or adjacent the optical stack 16. The voltage $V_{bias}$ applied across the IMOD 12 on the right is sufficient to maintain the movable reflective layer 14 in the actuated position.

In FIG. 1, the reflective properties of pixels 12 are generally illustrated with arrows 13 indicating light incident upon the pixels 12, and light 15 reflecting from the IMOD 12 on the left. Although not illustrated in detail, it will be understood by one having ordinary skill in the art that most of the light 13 incident upon the pixels 12 will be transmitted through the transparent substrate 20, toward the optical stack 16. A portion of the light incident upon the optical stack 16 will be transmitted through the partially reflective layer of the optical stack 16, and a portion will be reflected back through the transparent substrate 20. The portion of light 13 that is transmitted through the optical stack 16 will be reflected at the movable reflective layer 14, back toward (and through) the transparent substrate 20. Interference (constructive or destructive) between the light reflected from the partially reflective layer of the optical stack 16 and the light reflected from the movable reflective layer 14 will determine the wavelength(s) of light 15 reflected from the IMOD 12.

The optical stack 16 can include a single layer or several layers. The layer(s) can include one or more of an electrode layer, a partially reflective and partially transmissive layer and a transparent dielectric layer. In some implementations, the optical stack 16 is electrically conductive, partially transparent and partially reflective, and may be fabricated, for example, by depositing one or more of the above layers onto a transparent substrate 20. The electrode layer can be formed from a variety of materials, such as various metals, for example indium tin oxide (ITO). The partially reflective layer can be formed from a variety of materials that are partially reflective, such as various metals, e.g., chromium (Cr), semiconductors, and dielectrics. The partially reflective layer can be formed of one or more layers of materials, and each of the layers can be formed of a single material or a combination of materials. In some implementations, the optical stack 16 can include a single semi-transparent thickness of metal or semiconductor which serves as both an optical absorber and conductor, while different, more conductive layers or portions (e.g., of the optical stack 16 or of other structures of the IMOD) can serve to bus signals between IMOD pixels. The optical stack 16 also can include one or more insulating or dielectric layers covering one or more conductive layers or a conductive/absorptive layer.

In some implementations, the layer(s) of the optical stack 16 can be patterned into parallel strips, and may form row electrodes in a display device as described further below. As will be understood by one having ordinary skill in the art, the term "patterned" is used herein to refer to masking as well as etching processes. In some implementations, a highly conductive and reflective material, such as aluminum (Al), may be used for the movable reflective layer 14, and these strips may form column electrodes in a display device. The movable reflective layer 14 may be formed as a series of parallel strips of a deposited metal layer or layers (orthogonal to the row electrodes of the optical stack 16) to form columns deposited on top of posts 18 and an intervening sacrificial material deposited between the posts 18. When the sacrificial material is etched away, a defined gap 19, or optical cavity, can be formed between the movable reflective layer 14 and the optical stack 16. In some implementations, the spacing between posts 18 may be approximately 1-1000 um, while the gap 19 may be less than 10,000 Angstroms (Å).

In some implementations, each pixel of the IMOD, whether in the actuated or relaxed state, is essentially a capacitor formed by the fixed and moving reflective layers. When no voltage is applied, the movable reflective layer 14 remains in a mechanically relaxed state, as illustrated by the IMOD 12 on the left in FIG. 1, with the gap 19 between the movable reflective layer 14 and optical stack 16. However, when a potential difference, e.g., voltage, is applied to at least one of a selected row and column, the capacitor formed at the intersection of the row and column electrodes at the corresponding pixel becomes charged, and electrostatic forces pull the electrodes together. If the applied voltage exceeds a threshold, the movable reflective layer 14 can deform and move near or against the optical stack 16. A dielectric layer (not shown) within the optical stack 16 may prevent shorting and control the separation distance between the layers 14 and 16, as illustrated by the actuated IMOD 12 on the right in FIG. 1. The behavior is the same regardless of the polarity of the applied potential difference. Though a series of pixels in an array may be referred to in some instances as "rows" or "columns," a person having ordinary skill in the art will readily understand that referring to one direction as a "row" and another as a "column" is arbitrary. Restated, in some orientations, the rows can be considered columns, and the columns considered to be rows. Furthermore, the display elements may be evenly arranged in orthogonal rows and columns (an "array"), or arranged in non-linear configurations, for example, having certain positional offsets with respect to one another (a "mosaic"). The terms "array" and "mosaic" may refer to either configuration. Thus, although the display is referred to as including an "array" or "mosaic," the elements themselves need not be arranged orthogonally to one another, or disposed in an even distribution, in any instance, but may include arrangements having asymmetric shapes and unevenly distributed elements.

Figure 2:
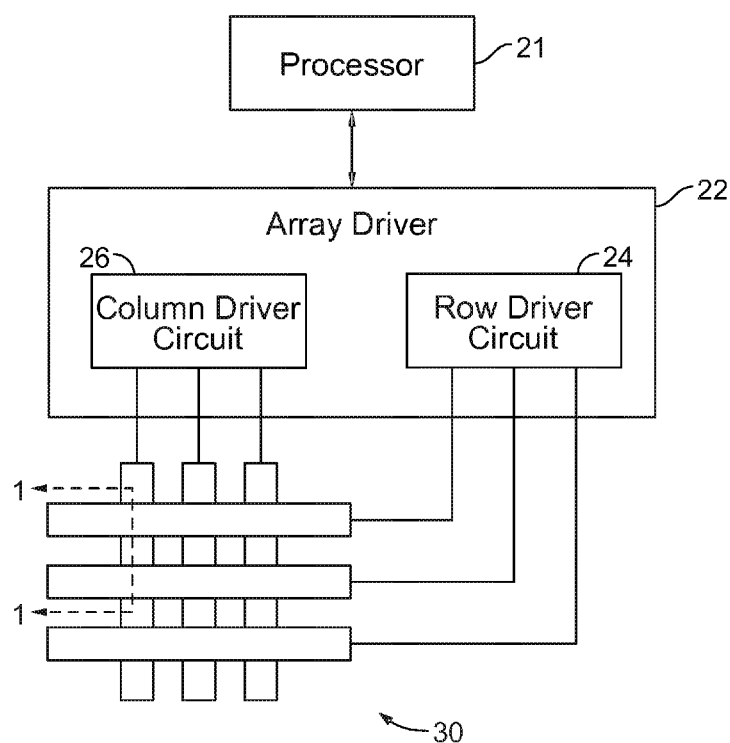
FIG. 2 shows an example of a system block diagram illustrating an electronic device incorporating a 3×3 interferometric modulator display.

FIG. 2 shows an example of a system block diagram illustrating an electronic device incorporating a 3×3 interferometric modulator display. The electronic device includes a processor 21 that may be configured to execute one or more software modules. In addition to executing an operating system, the processor 21 may be configured to execute one or more software applications, including a web browser, a telephone application, an email program, or other software application.

The processor 21 can be configured to communicate with an array driver 22. The array driver 22 can include a row driver circuit 24 and a column driver circuit 26 that provide signals to, e.g., a display array or panel 30. The cross section of the IMOD display device illustrated in FIG. 1 is shown by the lines 1-1 in FIG. 2. Although FIG. 2 illustrates a 3×3 array of IMODs for the sake of clarity, the display array 30 may contain a very large number of IMODs, and may have a different number of IMODs in rows than in columns, and vice versa.

Figures 3, 4:
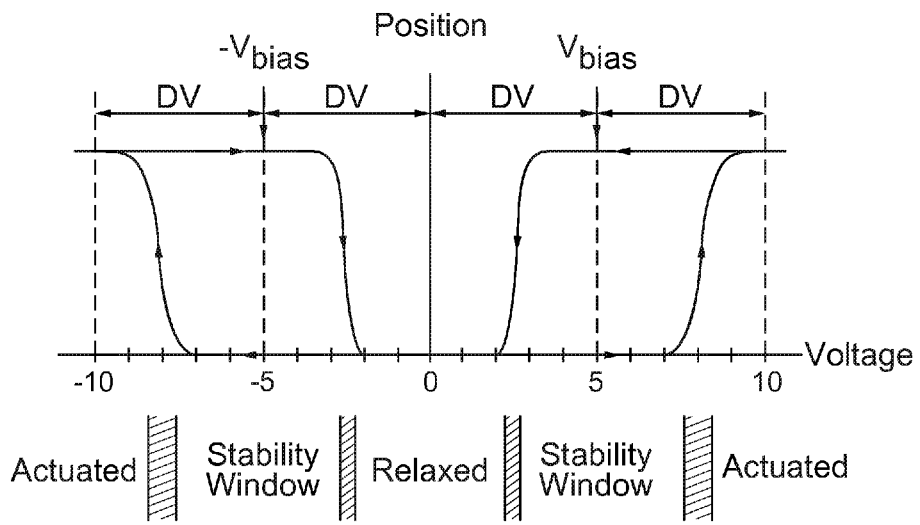
FIG. 3 shows an example of a diagram illustrating movable reflective layer position versus applied voltage for the interferometric modulator of FIG. 1.
FIG. 4 shows an example of a table illustrating various states of an interferometric modulator when various common and segment voltages are applied.

FIG. 3 shows an example of a diagram illustrating movable reflective layer position versus applied voltage for the interferometric modulator of FIG. 1. For MEMS interferometric modulators, the row/column (i.e., common/segment) write procedure may take advantage of a hysteresis property of these devices as illustrated in FIG. 3. An interferometric modulator may require, for example, about a 10-volt potential difference to cause the movable reflective layer, or mirror, to change from the relaxed state to the actuated state. When the voltage is reduced from that value, the movable reflective layer maintains its state as the voltage drops back below, e.g., 10 volts, however, the movable reflective layer does not relax completely until the voltage drops below 2 volts. Thus, a range of voltage, approximately 3 to 7 volts, as shown in FIG. 3, exists where there is a window of applied voltage within which the device is stable in either the relaxed or actuated state. This is referred to herein as the "hysteresis window" or "stability window." For a display array 30 having the hysteresis characteristics of FIG. 3, the row/column write procedure can be designed to address one or more rows at a time, such that during the addressing of a given row, pixels in the addressed row that are to be actuated are exposed to a voltage difference of about 10 volts, and pixels that are to be relaxed are exposed to a voltage difference of near zero volts. After addressing, the pixels are exposed to a steady state or bias voltage difference of approximately 5-volts such that they remain in the previous strobing state. In this example, after being addressed, each pixel sees a potential difference within the "stability window" of about 3-7 volts. This hysteresis property feature enables the pixel design, e.g., illustrated in FIG. 1, to remain stable in either an actuated or relaxed pre-existing state under the same applied voltage conditions. Since each IMOD pixel, whether in the actuated or relaxed state, is essentially a capacitor formed by the fixed and moving reflective layers, this stable state can be held at a steady voltage within the hysteresis window without substantially consuming or losing power. Moreover, essentially little or no current flows into the IMOD pixel if the applied voltage potential remains substantially fixed.

In some implementations, a frame of an image may be created by applying data signals in the form of "segment" voltages along the set of column electrodes, in accordance with the desired change (if any) to the state of the pixels in a given row. Each row of the array can be addressed in turn, such that the frame is written one row at a time. To write the desired data to the pixels in a first row, segment voltages corresponding to the desired state of the pixels in the first row can be applied on the column electrodes, and a first row pulse in the form of a specific "common" voltage or signal can be applied to the first row electrode. The set of segment voltages can then be changed to correspond to the desired change (if any) to the state of the pixels in the second row, and a second common voltage can be applied to the second row electrode. In some implementations, the pixels in the first row are unaffected by the change in the segment voltages applied along the column electrodes, and remain in the state they were set to during the first common voltage row pulse. This process may be repeated for the entire series of rows, or alternatively, columns, in a sequential fashion to produce the image frame. The frames can be refreshed and/or updated with new image data by continually repeating this process at some desired number of frames per second.

The combination of segment and common signals applied across each pixel (that is, the potential difference across each pixel) determines the resulting state of each pixel. FIG. 4 shows an example of a table illustrating various states of an interferometric modulator when various common and segment voltages are applied. As will be readily understood by one having ordinary skill in the art, the "segment" voltages can be applied to either the column electrodes or the row electrodes, and the "common" voltages can be applied to the other of the column electrodes or the row electrodes.

As illustrated in FIG. 4 (as well as in the timing diagram shown in FIG. 5B), when a release voltage $VC_{REL}$ is applied along a common line, all interferometric modulator elements along the common line will be placed in a relaxed state, alternatively referred to as a released or unactuated state, regardless of the voltage applied along the segment lines, i.e., high segment voltage $VS_H$ and low segment voltage $VS_L$. In particular, when the release voltage $VC_{REL}$ is applied along a common line, the potential voltage across the modulator (alternatively referred to as a pixel voltage) is within the relaxation window (see FIG. 3, also referred to as a release window) both when the high segment voltage $VS_H$ and the low segment voltage $VS_L$ are applied along the corresponding segment line for that pixel.

When a hold voltage is applied on a common line, such as a high hold voltage $VC_{HOLD\_H}$ or a low hold voltage $VC_{HOLD\_L}$, the state of the interferometric modulator will remain constant. For example, a relaxed IMOD will remain in a relaxed position, and an actuated IMOD will remain in an actuated position. The hold voltages can be selected such that the pixel voltage will remain within a stability window both when the high segment voltage $VS_H$ and the low segment voltage $VS_L$ are applied along the corresponding segment line. Thus, the segment voltage swing, i.e., the difference between the high $VS_H$ and low segment voltage $VS_L$, is less than the width of either the positive or the negative stability window.

When an addressing, or actuation, voltage is applied on a common line, such as a high addressing voltage $VC_{ADD\_H}$ or a low addressing voltage $VC_{ADD\_L}$, data can be selectively written to the modulators along that line by application of segment voltages along the respective segment lines. The segment voltages may be selected such that actuation is dependent upon the segment voltage applied. When an addressing voltage is applied along a common line, application of one segment voltage will result in a pixel voltage within a stability window, causing the pixel to remain unactuated. In contrast, application of the other segment voltage will result in a pixel voltage beyond the stability window, resulting in actuation of the pixel. The particular segment voltage which causes actuation can vary depending upon which addressing voltage is used. In some implementations, when the high addressing voltage $VC_{ADD\_H}$ is applied along the common line, application of the high segment voltage $VS_H$ can cause a modulator to remain in its current position, while application of the low segment voltage $VS_L$ can cause actuation of the modulator. As a corollary, the effect of the segment voltages can be the opposite when a low addressing voltage $VC_{ADD\_L}$ is applied, with high segment voltage $VS_H$ causing actuation of the modulator, and low segment voltage $VS_L$ having no effect (i.e., remaining stable) on the state of the modulator.

In some implementations, hold voltages, address voltages, and segment voltages may be used which always produce the same polarity potential difference across the modulators. In some other implementations, signals can be used which alternate the polarity of the potential difference of the modulators. Alternation of the polarity across the modulators (that is, alternation of the polarity of write procedures) may reduce or inhibit charge accumulation which could occur after repeated write operations of a single polarity.

Figure 5A:
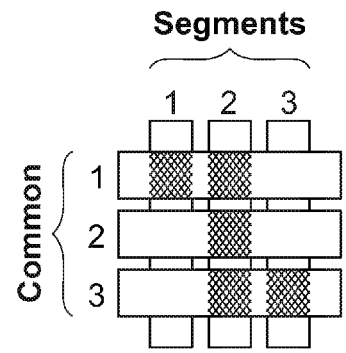
FIG. 5A shows an example of a diagram illustrating a frame of display data in the 3×3 interferometric modulator display of FIG. 2.
Figure 5B:
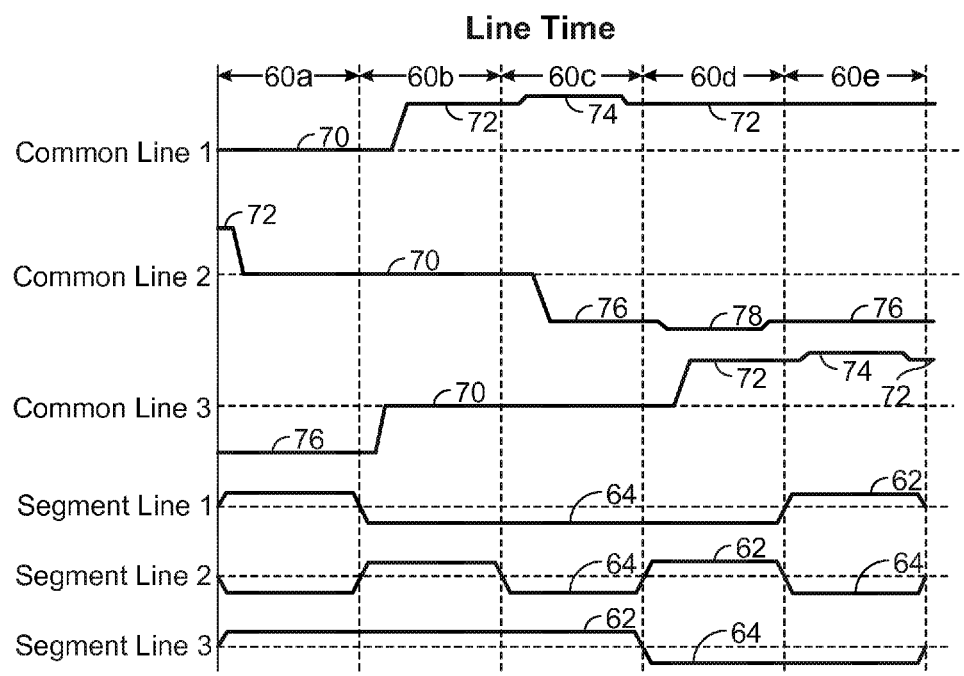
FIG. 5B shows an example of a timing diagram for common and segment signals that may be used to write the frame of display data illustrated in FIG. 5A.

FIG. 5A shows an example of a diagram illustrating a frame of display data in the 3×3 interferometric modulator display of FIG. 2. FIG. 5B shows an example of a timing diagram for common and segment signals that may be used to write the frame of display data illustrated in FIG. 5A. The signals can be applied to the, e.g., 3×3 array of FIG. 2, which will ultimately result in the line time 60e display arrangement illustrated in FIG. 5A. The actuated modulators in FIG. 5A are in a dark-state, i.e., where a substantial portion of the reflected light is outside of the visible spectrum so as to result in a dark appearance to, e.g., a viewer. Prior to writing the frame illustrated in FIG. 5A, the pixels can be in any state, but the write procedure illustrated in the timing diagram of FIG. 5B presumes that each modulator has been released and resides in an unactuated state before the first line time 60a.

During the first line time 60a, a release voltage 70 is applied on common line 1; the voltage applied on common line 2 begins at a high hold voltage 72 and moves to a release voltage 70; and a low hold voltage 76 is applied along common line 3. Thus, the modulators (common 1, segment 1), (1,2) and (1,3) along common line 1 remain in a relaxed, or unactuated, state for the duration of the first line time 60a, the modulators (2,1), (2,2) and (2,3) along common line 2 will move to a relaxed state, and the modulators (3,1), (3,2) and (3,3) along common line 3 will remain in their previous state. With reference to FIG. 4, the segment voltages applied along segment lines 1, 2 and 3 will have no effect on the state of the interferometric modulators, as none of common lines 1, 2 or 3 are being exposed to voltage levels causing actuation during line time 60a (i.e., $VC_{REL}$-relax and $VC_{HOLD\_L}$-stable).

During the second line time 60b, the voltage on common line 1 moves to a high hold voltage 72, and all modulators along common line 1 remain in a relaxed state regardless of the segment voltage applied because no addressing, or actuation, voltage was applied on the common line 1. The modulators along common line 2 remain in a relaxed state due to the application of the release voltage 70, and the modulators (3,1), (3,2) and (3,3) along common line 3 will relax when the voltage along common line 3 moves to a release voltage 70.

During the third line time 60c, common line 1 is addressed by applying a high address voltage 74 on common line 1. Because a low segment voltage 64 is applied along segment lines 1 and 2 during the application of this address voltage, the pixel voltage across modulators (1,1) and (1,2) is greater than the high end of the positive stability window (i.e., the voltage differential exceeded a predefined threshold) of the modulators, and the modulators (1,1) and (1,2) are actuated. Conversely, because a high segment voltage 62 is applied along segment line 3, the pixel voltage across modulator (1,3) is less than that of modulators (1,1) and (1,2), and remains within the positive stability window of the modulator; modulator (1,3) thus remains relaxed. Also during line time 60c, the voltage along common line 2 decreases to a low hold voltage 76, and the voltage along common line 3 remains at a release voltage 70, leaving the modulators along common lines 2 and 3 in a relaxed position.

During the fourth line time 60d, the voltage on common line 1 returns to a high hold voltage 72, leaving the modulators along common line 1 in their respective addressed states. The voltage on common line 2 is decreased to a low address voltage 78. Because a high segment voltage 62 is applied along segment line 2, the pixel voltage across modulator (2,2) is below the lower end of the negative stability window of the modulator, causing the modulator (2,2) to actuate. Conversely, because a low segment voltage 64 is applied along segment lines 1 and 3, the modulators (2,1) and (2,3) remain in a relaxed position. The voltage on common line 3 increases to a high hold voltage 72, leaving the modulators along common line 3 in a relaxed state.

Finally, during the fifth line time 60e, the voltage on common line 1 remains at high hold voltage 72, and the voltage on common line 2 remains at a low hold voltage 76, leaving the modulators along common lines 1 and 2 in their respective addressed states. The voltage on common line 3 increases to a high address voltage 74 to address the modulators along common line 3. As a low segment voltage 64 is applied on segment lines 2 and 3, the modulators (3,2) and (3,3) actuate, while the high segment voltage 62 applied along segment line 1 causes modulator (3,1) to remain in a relaxed position. Thus, at the end of the fifth line time 60e, the 3×3 pixel array is in the state shown in FIG. 5A, and will remain in that state as long as the hold voltages are applied along the common lines, regardless of variations in the segment voltage which may occur when modulators along other common lines (not shown) are being addressed.

In the timing diagram of FIG. 5B, a given write procedure (i.e., line times 60a-60e) can include the use of either high hold and address voltages, or low hold and address voltages. Once the write procedure has been completed for a given common line (and the common voltage is set to the hold voltage having the same polarity as the actuation voltage), the pixel voltage remains within a given stability window, and does not pass through the relaxation window until a release voltage is applied on that common line. Furthermore, as each modulator is released as part of the write procedure prior to addressing the modulator, the actuation time of a modulator, rather than the release time, may determine the necessary line time. Specifically, in implementations in which the release time of a modulator is greater than the actuation time, the release voltage may be applied for longer than a single line time, as depicted in FIG. 5B. In some other implementations, voltages applied along common lines or segment lines may vary to account for variations in the actuation and release voltages of different modulators, such as modulators of different colors.

Figure 6A:
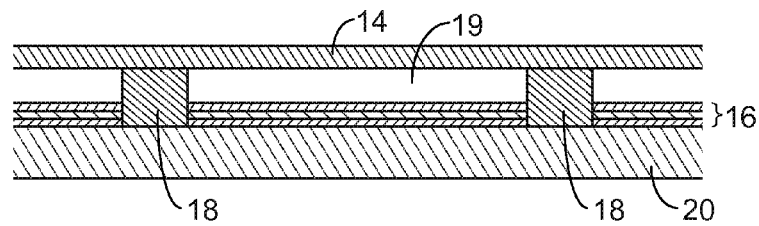
FIG. 6A shows an example of a partial cross-section of the interferometric modulator display of FIG. 1.
Figure 6B:
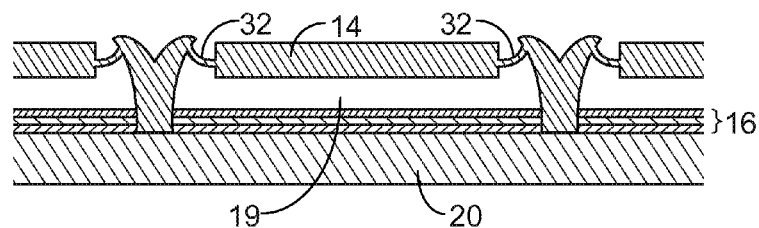
FIGS. 6B-6E show examples of cross-sections of varying implementations of interferometric modulators.
Figure 6C:
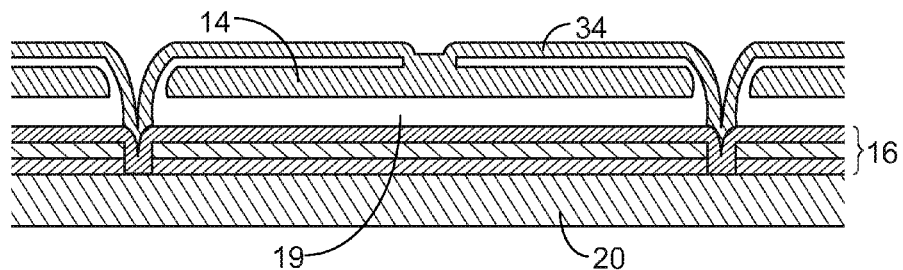

The details of the structure of interferometric modulators that operate in accordance with the principles set forth above may vary widely. For example, FIGS. 6A-6E show examples of cross-sections of varying implementations of interferometric modulators, including the movable reflective layer 14 and its supporting structures. FIG. 6A shows an example of a partial cross-section of the interferometric modulator display of FIG. 1, where a strip of metal material, i.e., the movable reflective layer 14 is deposited on supports 18 extending orthogonally from the substrate 20. In FIG. 6B, the movable reflective layer 14 of each IMOD is generally square or rectangular in shape and attached to supports at or near the corners, on tethers 32. In FIG. 6C, the movable reflective layer 14 is generally square or rectangular in shape and suspended from a deformable layer 34, which may include a flexible metal. The deformable layer 34 can connect, directly or indirectly, to the substrate 20 around the perimeter of the movable reflective layer 14. These connections are herein referred to as support posts. The implementation shown in FIG. 6C has additional benefits deriving from the decoupling of the optical functions of the movable reflective layer 14 from its mechanical functions, which are carried out by the deformable layer 34. This decoupling allows the structural design and materials used for the reflective layer 14 and those used for the deformable layer 34 to be optimized independently of one another.

Figure 6D:
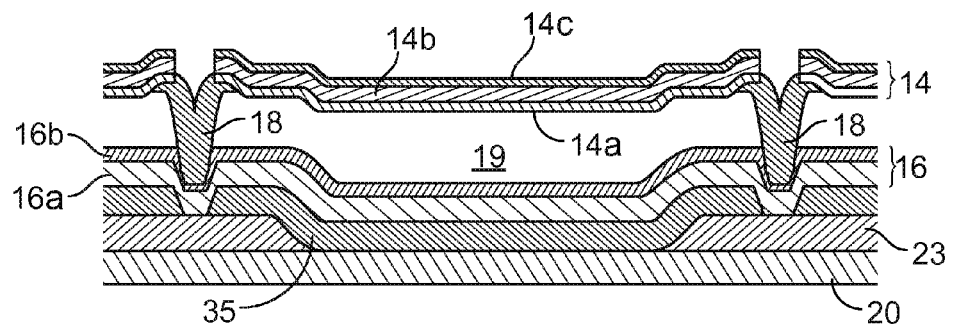

FIG. 6D shows another example of an IMOD, where the movable reflective layer 14 includes a reflective sub-layer 14a. The movable reflective layer 14 rests on a support structure, such as support posts 18. The support posts 18 provide separation of the movable reflective layer 14 from the lower stationary electrode (i.e., part of the optical stack 16 in the illustrated IMOD) so that a gap 19 is formed between the movable reflective layer 14 and the optical stack 16, for example when the movable reflective layer 14 is in a relaxed position. The movable reflective layer 14 also can include a conductive layer 14c, which may be configured to serve as an electrode, and a support layer 14b. In this example, the conductive layer 14c is disposed on one side of the support layer 14b, distal from the substrate 20, and the reflective sub-layer 14a is disposed on the other side of the support layer 14b, proximal to the substrate 20. In some implementations, the reflective sub-layer 14a can be conductive and can be disposed between the support layer 14b and the optical stack 16. The support layer 14b can include one or more layers of a dielectric material, for example, silicon oxynitride (SiON) or silicon dioxide ($SiO_2$). In some implementations, the support layer 14b can be a stack of layers, such as, for example, a $SiO_2$/SiON/$SiO_2$ tri-layer stack. Either or both of the reflective sub-layer 14a and the conductive layer 14c can include, e.g., an aluminum (Al) alloy with about 0.5% copper (Cu), or another reflective metallic material. Employing conductive layers 14a, 14c above and below the dielectric support layer 14b can balance stresses and provide enhanced conduction. In some implementations, the reflective sub-layer 14a and the conductive layer 14c can be formed of different materials for a variety of design purposes, such as achieving specific stress profiles within the movable reflective layer 14.

As illustrated in FIG. 6D, some implementations also can include a black mask structure 23. The black mask structure 23 can be formed in optically inactive regions (e.g., between pixels or under posts 18) to absorb ambient or stray light. The black mask structure 23 also can improve the optical properties of a display device by inhibiting light from being reflected from or transmitted through inactive portions of the display, thereby increasing the contrast ratio. Additionally, the black mask structure 23 can be conductive and be configured to function as an electrical bussing layer. In some implementations, the row electrodes can be connected to the black mask structure 23 to reduce the resistance of the connected row electrode. The black mask structure 23 can be formed using a variety of methods, including deposition and patterning techniques. The black mask structure 23 can include one or more layers. For example, in some implementations, the black mask structure 23 includes a molybdenum-chromium (MoCr) layer that serves as an optical absorber, an $SiO_2$ layer, and an aluminum alloy that serves as a reflector and a bussing layer, with a thickness in the range of about 30-80 Å, 500-1000 Å, and 500-6000 Å, respectively. The one or more layers can be patterned using a variety of techniques, including photolithography and dry etching, including, for example, carbon tetrafluoromethane ($CF_4$) and/or oxygen ($O_2$) for the MoCr and $SiO_2$ layers and chlorine ($Cl_2$) and/or boron trichloride ($BCl_3$) for the aluminum alloy layer. In some implementations, the black mask 23 can be an etalon or interferometric stack structure. In such interferometric stack black mask structures 23, the conductive absorbers can be used to transmit or bus signals between lower, stationary electrodes in the optical stack 16 of each row or column. In some implementations, a spacer layer 35 can serve to generally electrically isolate the absorber layer 16a from the conductive layers in the black mask 23.

Figure 6E:
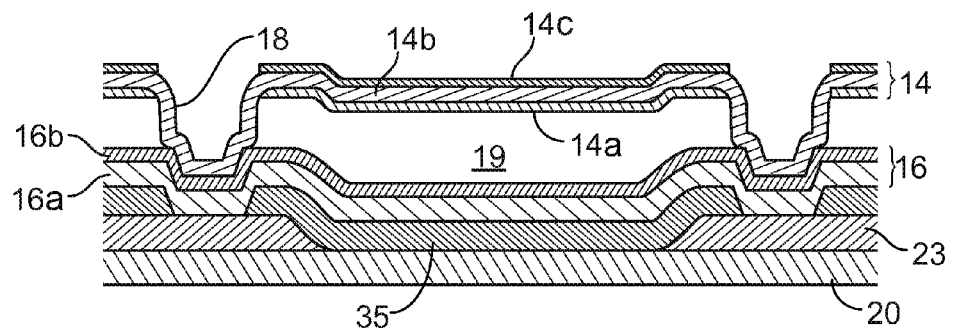

FIG. 6E shows another example of an IMOD, where the movable reflective layer 14 is self-supporting. In contrast with FIG. 6D, the implementation of FIG. 6E does not include support posts 18. Instead, the movable reflective layer 14 contacts the underlying optical stack 16 at multiple locations, and the curvature of the movable reflective layer 14 provides sufficient support that the movable reflective layer 14 returns to the unactuated position of FIG. 6E when the voltage across the interferometric modulator is insufficient to cause actuation. The optical stack 16, which may contain a plurality of several different layers, is shown here for clarity including an optical absorber 16a, and a dielectric 16b. In some implementations, the optical absorber 16a may serve both as a fixed electrode and as a partially reflective layer.

In implementations such as those shown in FIGS. 6A-6E, the IMODs function as direct-view devices, in which images are viewed from the front side of the transparent substrate 20, i.e., the side opposite to that upon which the modulator is arranged. In these implementations, the back portions of the device (that is, any portion of the display device behind the movable reflective layer 14, including, for example, the deformable layer 34 illustrated in FIG. 6C) can be configured and operated upon without impacting or negatively affecting the image quality of the display device, because the reflective layer 14 optically shields those portions of the device. For example, in some implementations a bus structure (not illustrated) can be included behind the movable reflective layer 14 which provides the ability to separate the optical properties of the modulator from the electromechanical properties of the modulator, such as voltage addressing and the movements that result from such addressing. Additionally, the implementations of FIGS. 6A-6E can simplify processing, such as, e.g., patterning.

Figure 7:
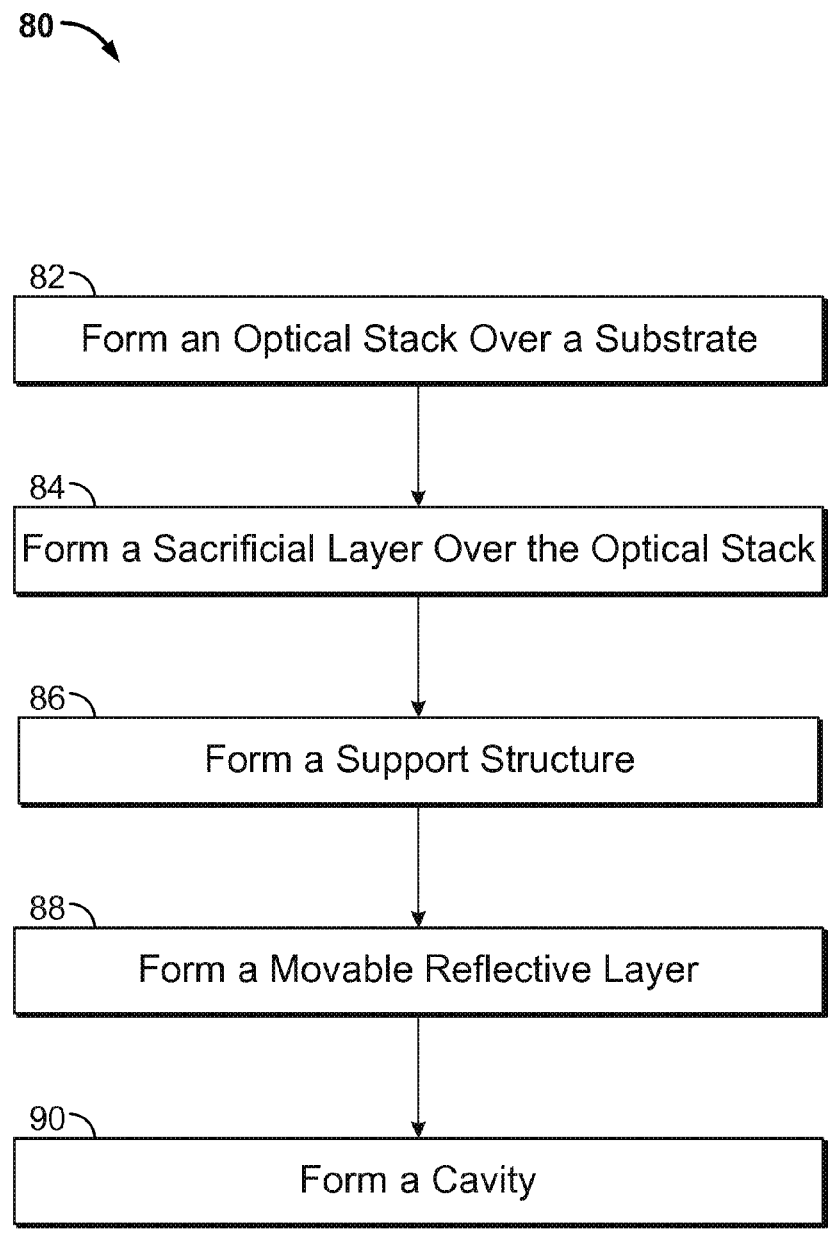
FIG. 7 shows an example of a flow diagram illustrating a manufacturing process for an interferometric modulator.
Figure 8A:
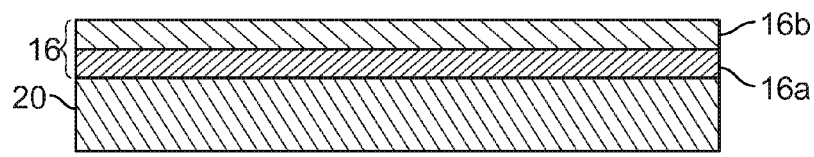
FIGS. 8A-8E show examples of cross-sectional schematic illustrations of various stages in a method of making an interferometric modulator.

FIG. 7 shows an example of a flow diagram illustrating a manufacturing process 80 for an interferometric modulator, and FIGS. 8A-8E show examples of cross-sectional schematic illustrations of corresponding stages of such a manufacturing process 80. In some implementations, the manufacturing process 80 can be implemented to manufacture, e.g., interferometric modulators of the general type illustrated in FIGS. 1 and 6, in addition to other blocks not shown in FIG. 7. With reference to FIGS. 1, 6 and 7, the process 80 begins at block 82 with the formation of the optical stack 16 over the substrate 20. FIG. 8A illustrates such an optical stack 16 formed over the substrate 20. The substrate 20 may be a transparent substrate such as glass or plastic, it may be flexible or relatively stiff and unbending, and may have been subjected to prior preparation processes, e.g., cleaning, to facilitate efficient formation of the optical stack 16. As discussed above, the optical stack 16 can be electrically conductive, partially transparent and partially reflective and may be fabricated, for example, by depositing one or more layers having the desired properties onto the transparent substrate 20. In FIG. 8A, the optical stack 16 includes a multilayer structure having sub-layers 16a and 16b, although more or fewer sub-layers may be included in some other implementations. In some implementations, one of the sub-layers 16a, 16b can be configured with both optically absorptive and conductive properties, such as the combined conductor/absorber sub-layer 16a. Additionally, one or more of the sub-layers 16a, 16b can be patterned into parallel strips, and may form row electrodes in a display device. Such patterning can be performed by a masking and etching process or another suitable process known in the art. In some implementations, one of the sub-layers 16a, 16b can be an insulating or dielectric layer, such as sub-layer 16b that is deposited over one or more metal layers (e.g., one or more reflective and/or conductive layers). In addition, the optical stack 16 can be patterned into individual and parallel strips that form the rows of the display.

Figure 8B:
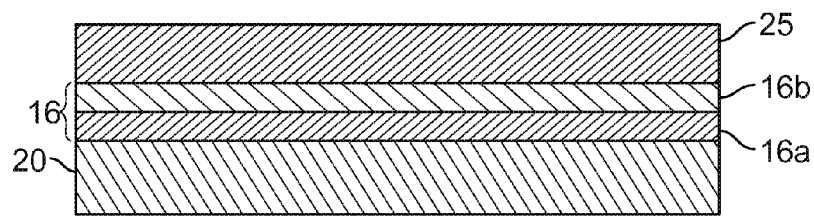

The process 80 continues at block 84 with the formation of a sacrificial layer 25 over the optical stack 16. The sacrificial layer 25 is later removed (e.g., at block 90) to form the cavity 19 and thus the sacrificial layer 25 is not shown in the resulting interferometric modulators 12 illustrated in FIG. 1. FIG. 8B illustrates a partially fabricated device including a sacrificial layer 25 formed over the optical stack 16. The formation of the sacrificial layer 25 over the optical stack 16 may include deposition of a xenon difluoride ($XeF_2$)-etchable material such as molybdenum (Mo) or amorphous silicon (Si), in a thickness selected to provide, after subsequent removal, a gap or cavity 19 (see also FIGS. 1 and 8E) having a desired design size. Deposition of the sacrificial material may be carried out using deposition techniques such as physical vapor deposition (PVD, e.g., sputtering), plasma-enhanced chemical vapor deposition (PECVD), thermal chemical vapor deposition (thermal CVD), or spin-coating.

Figure 8C:
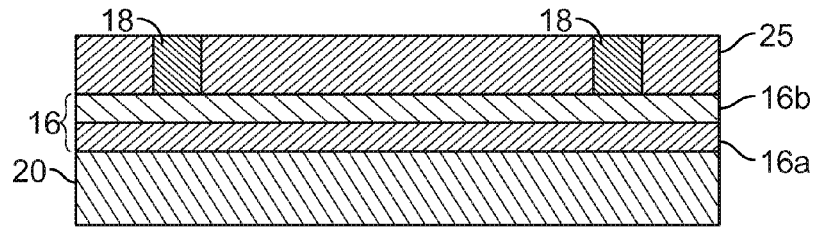

The process 80 continues at block 86 with the formation of a support structure e.g., a post 18 as illustrated in FIGS. 1, 6 and 8C. The formation of the post 18 may include patterning the sacrificial layer 25 to form a support structure aperture, then depositing a material (e.g., a polymer or an inorganic material, e.g., silicon oxide) into the aperture to form the post 18, using a deposition method such as PVD, PECVD, thermal CVD, or spin-coating. In some implementations, the support structure aperture formed in the sacrificial layer can extend through both the sacrificial layer 25 and the optical stack 16 to the underlying substrate 20, so that the lower end of the post 18 contacts the substrate 20 as illustrated in FIG. 6A. Alternatively, as depicted in FIG. 8C, the aperture formed in the sacrificial layer 25 can extend through the sacrificial layer 25, but not through the optical stack 16. For example, FIG. 8E illustrates the lower ends of the support posts 18 in contact with an upper surface of the optical stack 16. The post 18, or other support structures, may be formed by depositing a layer of support structure material over the sacrificial layer 25 and patterning to remove portions of the support structure material located away from apertures in the sacrificial layer 25. The support structures may be located within the apertures, as illustrated in FIG. 8C, but also can, at least partially, extend over a portion of the sacrificial layer 25. As noted above, the patterning of the sacrificial layer 25 and/or the support posts 18 can be performed by a patterning and etching process, but also may be performed by alternative etching methods.

Figure 8D:
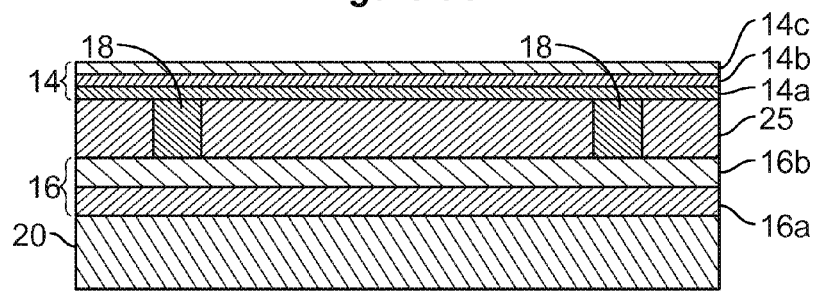
Figure 8E:
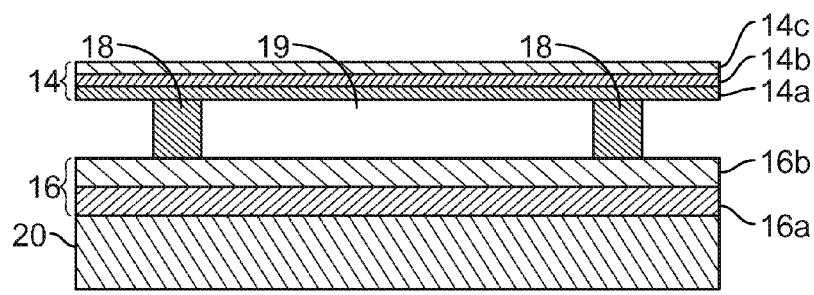

The process 80 continues at block 88 with the formation of a movable reflective layer or membrane such as the movable reflective layer 14 illustrated in FIGS. 1, 6 and 8D. The movable reflective layer 14 may be formed by employing one or more deposition processes, e.g., reflective layer (e.g., aluminum, aluminum alloy) deposition, along with one or more patterning, masking, and/or etching processes. The movable reflective layer 14 can be electrically conductive, and referred to as an electrically conductive layer. In some implementations, the movable reflective layer 14 may include a plurality of sub-layers 14a, 14b, 14c as shown in FIG. 8D. In some implementations, one or more of the sub-layers, such as sub-layers 14a, 14c, may include highly reflective sub-layers selected for their optical properties, and another sub-layer 14b may include a mechanical sub-layer selected for its mechanical properties. Since the sacrificial layer 25 is still present in the partially fabricated interferometric modulator formed at block 88, the movable reflective layer 14 is typically not movable at this stage. A partially fabricated IMOD that contains a sacrificial layer 25 also may be referred to herein as an "unreleased" IMOD. As described above in connection with FIG. 1, the movable reflective layer 14 can be patterned into individual and parallel strips that form the columns of the display.

The process 80 continues at block 90 with the formation of a cavity, e.g., cavity 19 as illustrated in FIGS. 1, 6 and 8E. The cavity 19 may be formed by exposing the sacrificial material 25 (deposited at block 84) to an etchant. For example, an etchable sacrificial material such as Mo or amorphous Si may be removed by dry chemical etching, e.g., by exposing the sacrificial layer 25 to a gaseous or vaporous etchant, such as vapors derived from solid $XeF_2$ for a period of time that is effective to remove the desired amount of material, typically selectively removed relative to the structures surrounding the cavity 19. Other combinations of etchable sacrificial material and etching methods, e.g. wet etching and/or plasma etching, also may be used. Since the sacrificial layer 25 is removed during block 90, the movable reflective layer 14 is typically movable after this stage. After removal of the sacrificial material 25, the resulting fully or partially fabricated IMOD may be referred to herein as a "released" IMOD.

Electronic devices may incorporate IMODs as part of a display of the electronic device. Such electronic devices also may include other various electronic components, including capacitor devices or capacitors. Two types of capacitors are a metal-insulator-metal (MIM) capacitor and a metal-insulator-metal-insulator-metal (MIMIM) capacitor. Such capacitors also may be referred to as embedded capacitors, embedded decoupling capacitors, and co-packaged capacitors.

Many portable or personal electronic devices, like mobile telephones, for example, may incorporate MIM capacitors that are used during the operation of the devices. With the continuing drive towards the reduction in the size of personal electronic devices, there is also a drive towards the reduction in the size of the electronic components, including MIM capacitors, which are part of the personal electronic devices. Thus, there is a demand for smaller capacitors that supply substantially the same capacitance as larger conventional capacitors. Such smaller capacitors have higher capacitance densities (e.g., a capacitance density of greater than about 200 nanofarads per millimeter squared ($nF/mm^2$)), which can be provided by some implementations of high aspect ratio MIM capacitors as discussed herein.

There are many factors to be considered when developing a high aspect ratio MIM capacitor. These factors include the available area for the capacitor, capacitance density, equivalent series resistance (ESR), equivalent series inductance (ESL), leakage, breakdown voltage, and operating voltage, etc. When limited to a fixed area, capacitance density and ESR may be inversely related. Increasing the capacitance density may decrease the ESR, and vice versa. Further, when building a high aspect ratio structure, the available materials for the electrodes of a MIM capacitor may be limited due to the available technologies able to deposit a specific material uniformly on a high aspect ratio feature. For instance, the material used for the electrodes may have a low resistivity such that thin layers of the material may be used.

As described herein, a MIM capacitor may be fabricated to provide a high capacitance density combined with a low ESR. For example, a MIM capacitor having a capacitance density of greater than about 200 nanofarads per millimeter squared ($nF/mm^2$), an ESR of about 20 milliohms (m$\Omega$) to 100 m$\Omega$, or less than about 50 m$\Omega$, and a breakdown voltage of greater than about 12 volts may be fabricated. A low ESR is important in the performance of radio frequency (RF) devices, as the electronic noise in a circuit, in general, increases exponentially with increases in ESR.

Figure 9:
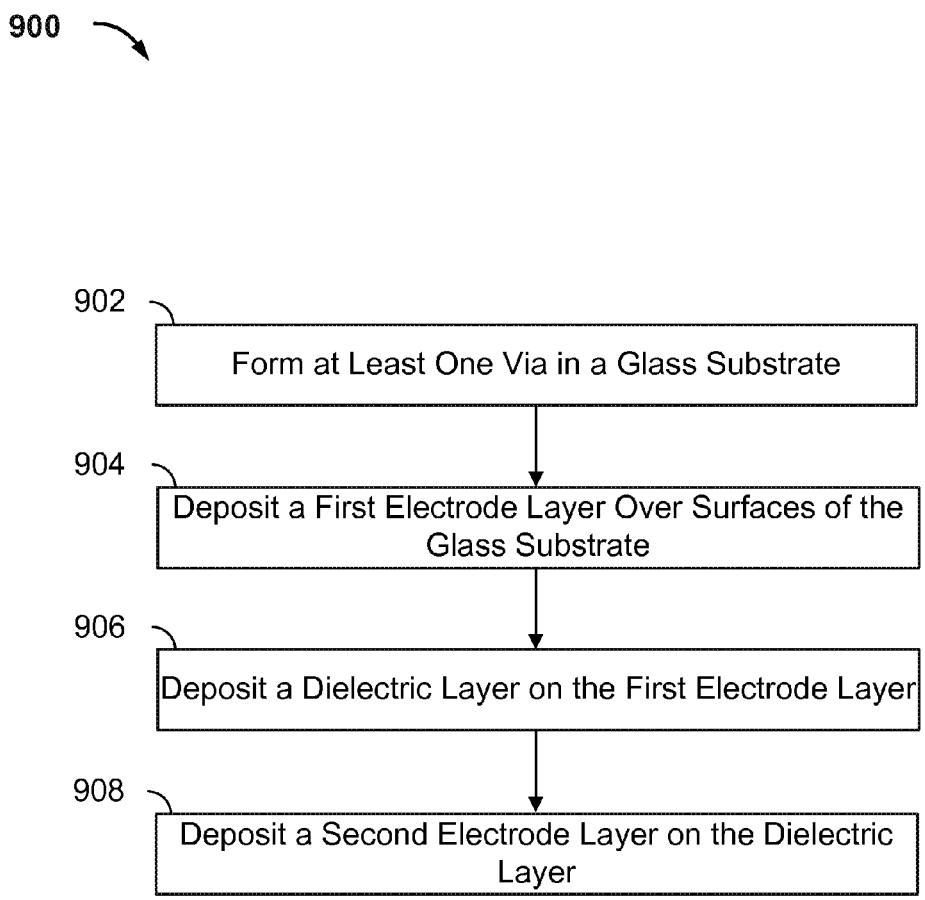
FIG. 9 shows an example of a flow diagram illustrating a manufacturing process for a MIM capacitor.

To aid in the understanding of implementations of MIM capacitors as described herein, one implementation of a manufacturing process for a MIM capacitor, accompanied by top-down and cross-sectional schematic illustrations of a MIM capacitor at various stages in the manufacturing process, is set forth below. FIG. 9 shows an example of a flow diagram illustrating a manufacturing process for a MIM capacitor. FIGS. 10A-10D show examples of schematic illustrations of a MIM capacitor at various stages in the manufacturing process. Each of FIGS. 10A-10D shows examples of both a top-down schematic illustration of the MIM capacitor and a cross-sectional schematic illustration of the MIM capacitor through line 1-1 in the top-down schematic illustration.

In the process 900 shown in FIG. 9, patterning techniques, including masking as well as etching processes, may be used to define the shapes of the different components of a MIM capacitor. At block 902 of the process 900, at least one via is formed in a glass substrate. In some implementations, the glass substrate may include a display glass, a borosilicate glass, or a photoimageable glass. One example of photoimageable glass is APEX™ Glass, manufactured by Life Bioscience Inc. (Albuquerque, N. Mex.). Photoimageable glasses are generally borosilicate-based glasses with oxide additions. In some implementations, the glass substrate may include a single sheet of glass, as opposed to a glass substrate including multiple sheets of glass that may be joined together to form a multi-layered glass substrate.

Different process, depending on the glass of the glass substrate, may be used to form the at least one via in the glass substrate. For example, for some glasses, such as a display glass or a borosilicate glass, a laser ablation process or a sandblasting process may be used to form the at least one via. In some implementations, for a photoimageable glass, the at least one via may be formed by exposing the photoimageable glass where the at least one via is to be formed to ultraviolet light. A mask, for example, may be used to define the area of the photoimageable glass that is exposed to ultraviolet light. The photoimageable glass may then be exposed to an elevated temperature. Exposing an area of the photoimageable glass to ultraviolet light and then exposing the photoimageable glass to an elevated temperature may result in a change of the structural and/or chemical properties of the area exposed to ultraviolet light. As a result, this exposed area may have a higher etch rate than the unexposed area of the photoimageable glass, allowing the at least one via to be etched in the photoimageable glass using an acid (e.g., hydrofluoric acid (HF)).

FIG. 10A shows examples of schematic illustrations of the partially fabricated MIM capacitor at this point (e.g., up through block 902) in the process 900. The MIM capacitor 1000 includes a glass substrate 1002 that defines at least one via 1004. In some implementations, the glass substrate 1002 may define a plurality of vias. In some implementations, the via 1004 may be a though glass via, as shown in FIG. 10A. In some other implementations, the via 1004 may be a blind via; i.e., the via 1004 may be a via that does not pass completely through the glass substrate 1002.

Dimensions 1008 and 1010 may each be about 250 microns, in some implementations. The dimensions 1008 and 1010 may each be about 1 millimeter, in some other implementations. The dimensions 1008 and 1010 also may each be larger than about 1 millimeter and smaller than about 250 microns, or between these two values, in some other implementations.

In some implementations, the glass substrate 1002 may be about 50 microns to 1.1 millimeters thick. In some implementations, the via 1004 may have an opening on a surface of the glass substrate 1002 of about 2 microns to 200 microns. In some implementations, the via 1004 may have an aspect ratio of at least about 10 to 1 (i.e., a ratio of the height of a via to the width of the via). For example, when the glass substrate is about 50 microns thick, a through glass via may have an opening on a surface of the substrate of about 5 microns or smaller. As another example, when the glass substrate is about 1.1 millimeters thick, a through glass via may have an opening on a surface of the substrate of about 110 microns or smaller. In some other implementations, the via may have an aspect ratio of about 10 to 1 to about 25 to 1. The via 1004 may have a circular cross section, a square cross section, a hexagonal cross section, or a cross section of any other shape.

Figure 11A:
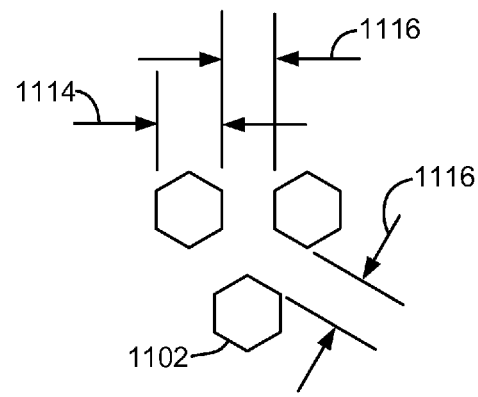
FIGS. 11A and 11B shows examples of top-down views of a plurality of vias that may be formed in a glass substrate.
Figure 11B:
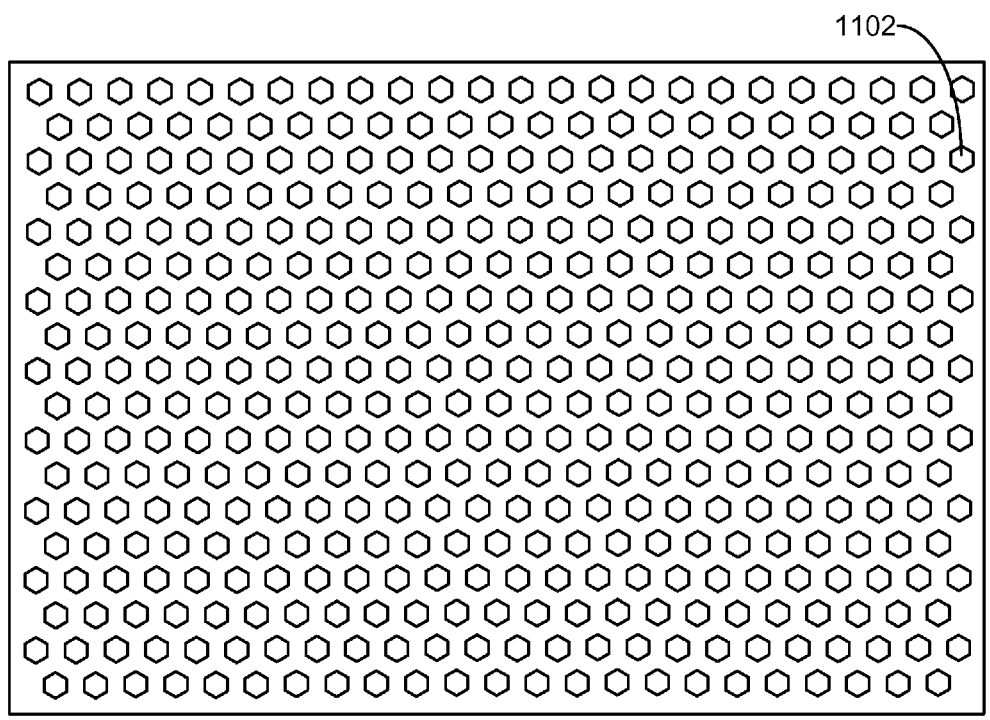

FIGS. 11A and 11B shows examples of top-down views of a plurality vias that may be formed in a glass substrate. The vias 1102 shown in FIG. 11A have a hexagonal cross section. Vias having a hexagonal cross section can be arranged in a pattern or an array in which the vias have a higher packing density than vias having cross section of other shapes (e.g., vias having a square cross section or vias having a triangular cross section), which may serve to increase the capacitance density of the MIM capacitor. A hexagonal diameter 1114 of a via or the opening of a via (i.e., a principal dimension of the via on the surface of the glass substrate) may be about 5 microns to 110 microns, in some implementations. A spacing 1116 between the vias 1102 may be about 10 microns to 300 microns.

FIG. 11B shows another example of a top-down view of a plurality of vias that may be formed in a glass substrate. The plurality of vias 1102 may include any number of vias. In some implementations, the plurality of vias may include about 2 vias to 10,000 vias, 50,000 vias, or 90,000 vias. The number of vias may vary with the principal dimension of the vias on the surface of the glass substrate and with the spacing between the vias 1102. Further, the number of vias 1102 may vary with the desired capacitance of the MIM capacitor being formed. For example, one or a few vias may be used for a picofarad capacitor (e.g., a 1 picofarad capacitor), whereas tens of thousands of vias may be used for a microfarad capacitor (e.g., a 65 microfarad capacitor).

Returning to FIG. 9, at block 904, a first electrode layer is deposited over surfaces of the glass substrate. The first electrode layer may be deposited over surfaces of the glass substrate, including surfaces of the at least one via. In some implementations, a dry film mask may be used to define the regions of the glass substrate onto which the first electrode layer is deposited. In some implementations, the first electrode layer may be deposited using a physical vapor deposition (PVD) process or a chemical vapor deposition (CVD) process.

In some other implementations, the first electrode layer may be deposited using a plating process. For example, a seed layer may first be deposited over surfaces of the glass substrate. In some implementations, the seed layer may be deposited using a CVD process, an atomic layer deposition (ALD) process, or an electroless plating process. In some implementations, the seed layer may include titanium nitride (TiN), ruthenium-titanium nitride (Ru—TiN), platinum (Pt), palladium (Pd), gold (Au), silver (Ag), Cu, nickel (Ni), Mo, or tungsten (W). In some implementations, the seed layer may be about 25 nanometers (nm) to 500 nm thick. After the seed layer is deposited, the first electrode layer may be deposited using a plating process, with the seed layer acting as a nucleation site for the plating process. The plating process may be an electroless plating process or an electroplating process. Cu, for example, may be plated onto the seed layer. In some implementations, the plated metal may not be the same metal as a metal of the seed layer. In some other implementations, the plated metal may be the same metal as a metal of the seed layer.

FIG. 10B shows examples of schematic illustrations of the partially fabricated MIM capacitor at this point (e.g., up through block 904) in the process 900. The MIM capacitor 1000 includes the glass substrate 1002 and a first electrode layer 1016. In some implementations, the first electrode layer 1016 may include Cu, a Cu alloy, Pd, Ag, Au, or another low resistivity metal (e.g., lower than about $13.5 \times 10^{-8}$ ohmmeter $\Omega \cdot m$) at 20 degrees Celsius (° C.)). In some implementations, the first electrode layer 1016 may be about 0.5 microns to 20 microns thick.

Returning to FIG. 9, at block 906 a dielectric layer 1020 is deposited on the first electrode layer. In some implementations, the dielectric layer 1020 may be deposited using a CVD process or an ALD process.

Figure 10C:
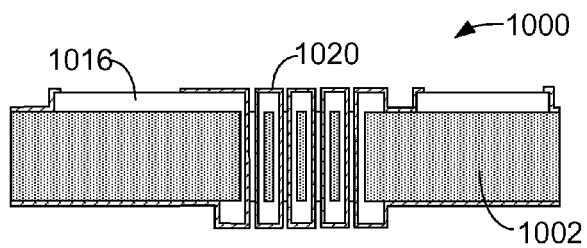
Figure 10C:
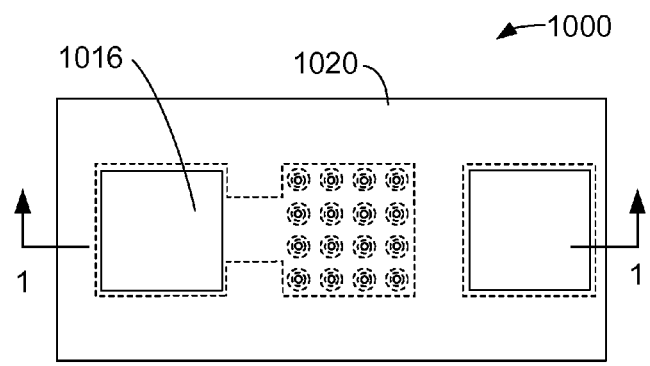

FIG. 10C shows examples of schematic illustrations of the partially fabricated MIM capacitor at this point (e.g., up through block 906) in the process 900. The MIM capacitor 1000 includes the glass substrate 1002, the first electrode layer 1016, and a dielectric layer 1020. In some implementations, the dielectric layer 1020 may include zirconium oxide ($ZrO_2$), aluminum oxide ($Al_2O_3$), strontium oxide (SrO), strontium tin oxide (STO), titanium oxide ($TiO_2$), combinations of layers of these different oxides, or other dielectrics. In some implementations, the dielectric layer may be about 4 nm to 100 nm thick, or about 10 nm to 35 nm thick.

Returning to FIG. 9, at block 908 a second electrode layer is deposited on the dielectric layer. In some implementations, the second electrode layer may be deposited using a PVD process, a CVD process, or a plating process, as described above with respect to the first electrode layer. In some implementations, a dry film mask may be used to define the regions of the dielectric layer onto which the second electrode layer is deposited.

Figure 10D:
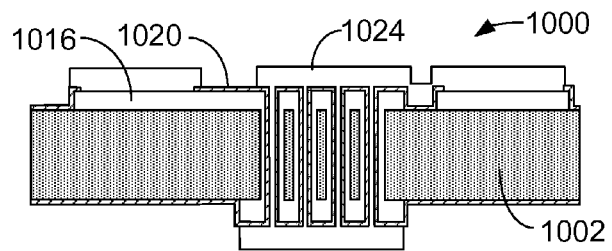
Figure 10D:
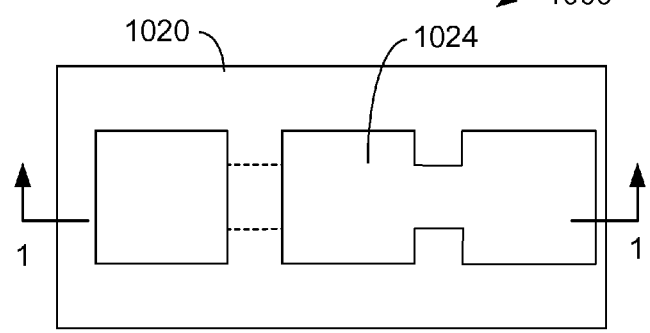

FIG. 10D shows examples of schematic illustrations of the partially fabricated MIM capacitor at this point (e.g., up through block 908) in the process 900. The MIM capacitor 1000 includes the glass substrate 1002, the first electrode layer 1016, the dielectric layer 1020, and a second electrode layer 1024. The dielectric layer 1020 may electrically isolate the first electrode layer 1016 from the second electrode layer 1024. In some implementations, the second electrode layer 1024 may include Cu, a Cu alloy, Pd, Ag, Au, or another low resistivity metal (e.g., lower than about $13.5 \times 10^{-8}$ $\Omega \cdot m$ at 20° C.). In some implementations, the first electrode layer 1016 and the second electrode layer 1024 may include the same metal. In some other implementations, the first electrode layer 1016 and the second electrode layer 1024 may include different metals. In some implementations, the second electrode layer 1024 may be about 0.5 microns to 50 microns thick. In some implementations, the first electrode layer 1016 and the second electrode layer 1024 may have about the same thickness. In some other implementations, the first electrode layer 1016 and the second electrode layer 1024 may have different thicknesses.

This completes the manufacturing process for a structure that is capable of yielding a capacitance. For example, a capacitance may be provided between the second electrode layer 1024 and the first electrode layer 1016 of the MIM capacitor 1000, with the second electrode layer 1024 and the first electrode layer 1016 being electrically isolated from one another by the dielectric layer 1020. Further process operations may be performed to complete the fabrication of the MIM capacitor, however.

For example, in some implementations, a passivation layer may be deposited on the partially fabricated MIM capacitor. In some implementations, the passivation layer may be deposited on the second electrode layer 1024 and on exposed areas of the dielectric layer 1020. In some implementations, the passivation layer may be deposited with a PVD process, a CVD process, an ALD process, a spin-on process, an extrusion process, or a lamination process. In some implementations, the passivation layer may include a dielectric layer. For example, the passivation layer may include an oxide, such as $SiO_2$, or a polymer. In some implementations, the passivation layer may be about 0.2 microns to 100 microns thick.

As another example, in some other implementations, a non-oxidizing layer may be deposited on the second electrode layer 1024. In some implementations, the non-oxidizing layer may TiN, Ru—TiN, Pt, Pd, Au, Mo, or W. In some implementations, the non-oxidizing layer may be about 5 nm to 50 nm thick.

The process 900 shown in FIG. 9 may be used to fabricate a MIM capacitor, as described above. In some implementations, the process 900 may include additional process operations, however.

In some implementations, the adhesion of the first electrode layer to the glass substrate may be poor. For example, when the first electrode layer is plated onto the glass substrate, the seed layer may delaminate from the glass substrate.

As another example, the first electrode layer may not plate at all onto the surfaces of the glass substrate.

To improve the adhesion of the first electrode layer to the glass substrate, the process 900 may include the additional process operation of depositing a dielectric adhesion layer on the surfaces of the glass substrate, including the surfaces of the at least one via, before depositing the first electrode layer. In some implementations, the dielectric adhesion layer may include an oxide layer. For example, the dielectric adhesion layer may include $SiO_2$, $Al_2O_3$, $ZrO_2$, hafnium oxide ($HfO_2$), yttrium oxide ($Y_2O_3$), tantalum oxide ($TaO_2$), a $SrO/TiO_2$ mixture, or $SiO_2$ doped with other oxides.

In some implementations, the dielectric adhesion layer may be deposited with an ALD process. ALD is a thin-film deposition technique performed with one or more chemical reactants, also referred to as precursors. ALD is based on sequential, self-limiting surface reactions. The precursors may be sequentially admitted to a reaction chamber in a gaseous state where they contact the work piece (i.e., the surface or surfaces that are being coated). For example, a first precursor may be adsorbed onto a surface when it is admitted to a reaction chamber. Then, the first precursor may react with a second precursor at the surface when the second precursor is admitted to the reaction chamber. By repeatedly exposing a surface to alternating sequential pulses of the precursors, a thin film of dielectric material may be deposited. ALD processes also include processes in which a surface is exposed to sequential pulses of a single precursor, which may deposit a thin film of dielectric material on the surface. ALD processes generally form a conformal layer, i.e., a layer that faithfully follows the contours of the underlying surface. Because ALD precursors are admitted to a reaction chamber in a gaseous state and do not depend on being activated by a plasma, and because ALD process reaction rates are surface-limited, the film may be deposited on all surfaces in the reaction chamber that are accessible to the gaseous precursors and suitable for deposition.

For example, in some implementations, an $Al_2O_3$ dielectric adhesion layer may be deposited using trimethyl aluminum (TMA) as an aluminum precursor gas and at least one of water ($H_2O$) or ozone ($O_3$) as an oxygen precursor gas. Other suitable precursor gases are also available. For example, other suitable aluminum precursor gases include tri-isobutyl aluminum (TIBAL), tri-ethyl/methyl aluminum (TEA/TMA), and dimethylaluminum hydride (DMAH).

In some implementations, the dielectric adhesion layer may be about 5 nm to 20 nm thick, or about 5 nm thick. In some implementations, depositing a dielectric adhesion layer of about 5 nm thick may be achieved with about 100 ALD process cycles.

In some implementations, the first electrode layer may be deposited on the dielectric adhesion layer using a PVD process, a CVD process, or a plating process. In some other implementations, before depositing the first electrode layer onto the dielectric adhesion layer, the dielectric adhesion layer may be treated. In some implementations, the dielectric adhesion layer may be treated by contacting the layer with a sulfuric acid ($H_2SO_4$) solution. For example, the $H_2SO_4$ solution may contain about 15% sulfuric acid and have a pH of about 5 to 8.2. The sulfuric acid solution may chemically activate the dielectric adhesion layer such that copper, for example, may be plated onto the dielectric adhesion layer.

While the dielectric adhesion layer is described with respect to the adhesion of a first electrode layer to a glass substrate, a dielectric adhesion layer also may improve the adhesion of any metal layer that is part of an electronic circuit fabricated on a glass substrate.

The process 900 shown in FIG. 9 also may include the additional process operation of depositing a non-oxidizing layer on the first electrode layer. In some implementations, the non-oxidizing layer may include TiN, Ru—TiN, Pt, Pd, Au, Mo, or W. In some implementations, the non-oxidizing layer may be about 5 nm to 50 nm thick.

As shown in FIG. 10D, the second electrode layer 1024 may substantially fill the vias. In some implementations, however, the second electrode layer may not substantially fill the vias. For example, instead of the second electrode layer substantially filling the vias, there may be hollow regions or voids in the vias. That is, the surface of a via may be covered with a conformal layer of the second electrode layer, which defines a hollow region within the via. In some other implementations, instead of the second electrode layer 1024 substantially filling the vias, the vias may be filled with a dielectric material deposited onto the second electrode layer 1024. Filling the vias with a dielectric material may add a parasitic capacitance when the MIM capacitor is operating, however.

In some implementations, the apparatus described herein may function as interposers. An interposer may serve to electrically connect a first electronic component to a second electronic component. For example, an interposer may electrically connect an integrated circuit to a printed circuit board. When a glass substrate serves as an interposer, a MIM capacitor on the glass substrate may function as a decoupling capacitor. A decoupling capacitor may function to decouple one part of an electronic circuit from another. The decoupling capacitor may be configured as a shunt between the two parts of the electronic circuit, such that the effect of electronic noise generated by a first part of the electronic circuit on a second part of the electronic circuit may be reduced.

Figure 12:
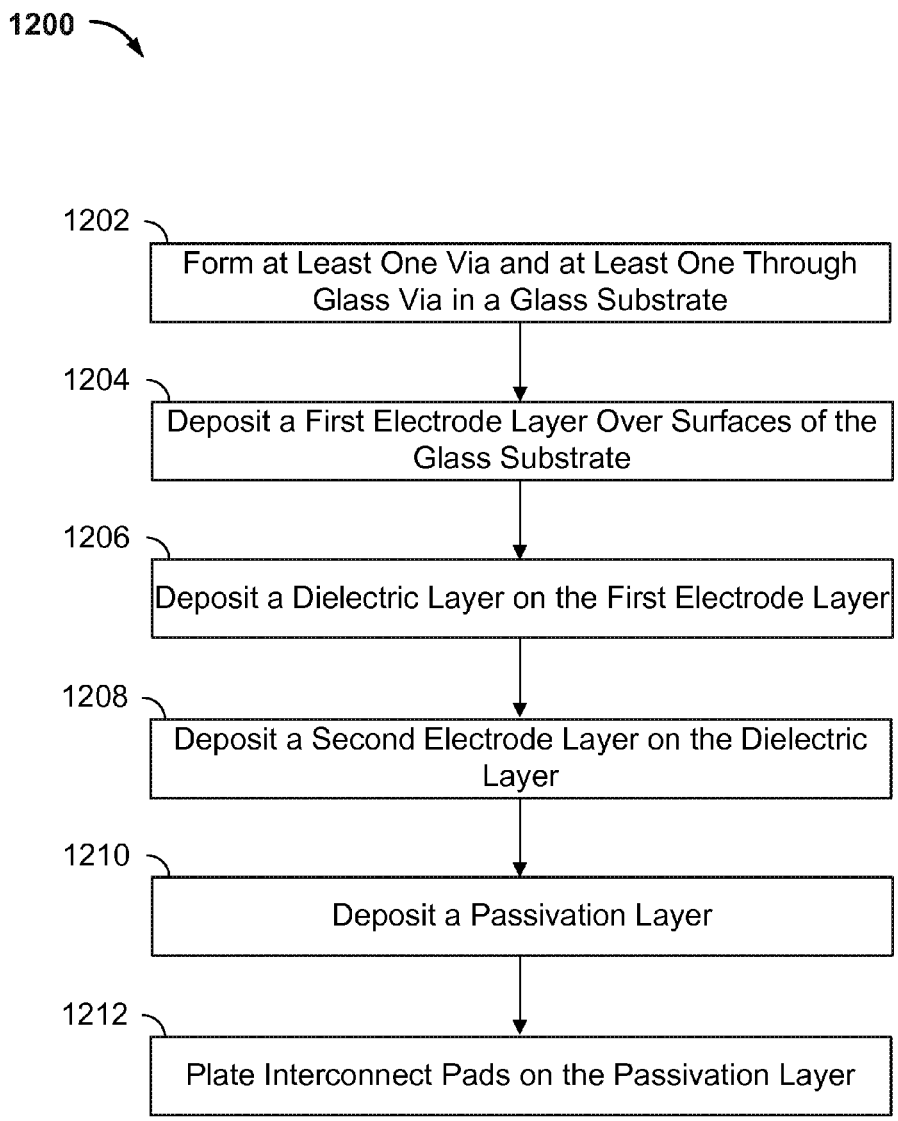
FIG. 12 shows an example of a flow diagram illustrating a manufacturing process for a glass interposer.

FIG. 12 shows an example of a flow diagram illustrating a manufacturing process for a glass interposer. FIGS. 13A-13F show examples of schematic illustrations of a glass interposer at various stages in the manufacturing process. Each of FIGS. 13A-13F shows examples of both a top-down schematic illustration of the glass interposer and a cross-sectional schematic illustration of the glass interposer through line 1-1 in the top-down schematic illustration. Some implementations of the process 1200 shown in FIG. 12 may be similar to some implementations of the process 900. In the process 1200, however, through glass vias may be formed in the glass substrate that may serve as interconnects for electronic components. FIG. 13G shows an example of a cross-sectional schematic illustration of a glass interposer electrically connecting a first electronic component to a second electronic component. Further, in the process 1200, two MIM capacitors are formed simultaneously. Two, three, or more MIM capacitors may be fabricated simultaneously with the processes 900 and 1200. In the process 1200 shown in FIG. 12, patterning techniques, including masking as well as etching processes, may be used to define the shapes of the different components of the glass interposer during the manufacturing process. The process 1200 is described further, below.

At block 1202 of the process 1200, at least one via and at least one through glass via are formed in a glass substrate. In some implementations, the glass substrate may include a display glass, a borosilicate glass, or a photoimageable glass. Different process, depending on the glass of the glass substrate, may be used to form the at least one via and the at least one through glass via in the glass substrate, as described with respect to block 902 of the process 900. In some implementations, forming the at least one via and the at least one through glass via may be performed substantially simultaneously.

Figure 13A:
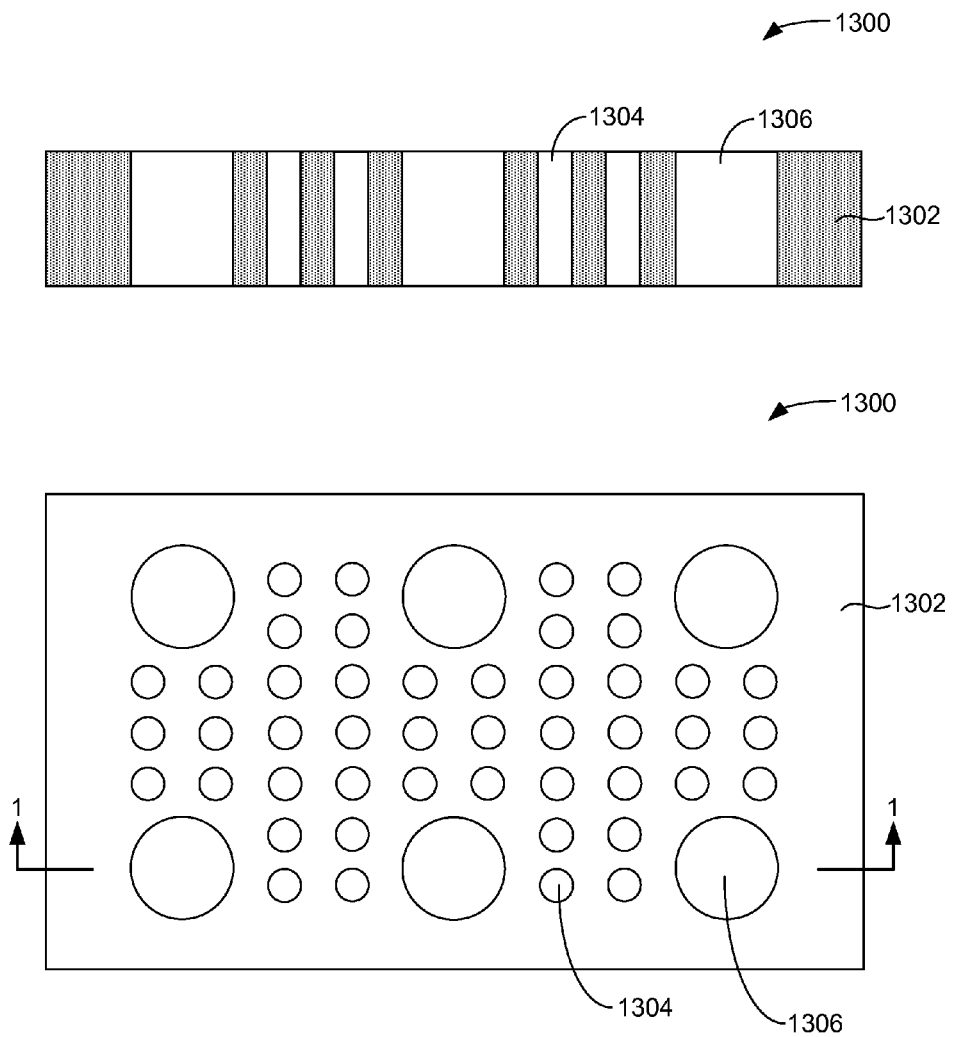
FIGS. 13A-13F show examples of schematic illustrations of a glass interposer at various stages in the manufacturing process.

FIG. 13A shows examples of schematic illustrations of the partially fabricated glass interposer (e.g., up through block 1202) in the process 1200. The glass interposer 1300 includes a glass substrate 1302 that defines at least one via 1304 and at least one through glass via 1306. In some implementations, the glass substrate 1302 may define a plurality of vias and a plurality of through glass vias. The at least one via 1304 may become part of a structure that forms a MIM capacitor, and the at least one though glass via 1306 may become part of a structure that serves to electrically connect two electronic components.

In some implementations, the glass substrate 1302 may be about 50 microns to 1.1 millimeters thick. In some implementations, the via 1304 may define an opening on a surface of the glass substrate 1302 of about 2 microns to 200 microns. In some implementations, the via 1304 may have an aspect ratio of at least about 10 to 1 (i.e., a ratio of the height of a via to the width of the via). In some implementations, the through glass via 1306 may have an opening on a surface of the glass substrate 1302 of about 80 microns to 300 microns. The via 1304 and the through glass via 1306 may have a circular cross section, a square cross section, a hexagonal cross section, or a cross section of any other shape. For example, in some implementations, when the substrate defines a plurality of vias, the vias may have a hexagonal cross section, as described with respect to FIGS. 11A and 11B.

Returning to FIG. 12, at block 1204 a first electrode layer is deposited over surfaces of the glass substrate. The first electrode layer may be deposited over surfaces of the glass substrate, including surfaces of the at least one via. In some implementations, the first electrode layer may be deposited using a PVD process, a CVD process, or a plating process, as described with respect to block 904 in the process 900. In some implementations, a dry film mask may be used to define the regions of the glass substrate onto which the first electrode layer is deposited.

Figure 13B:
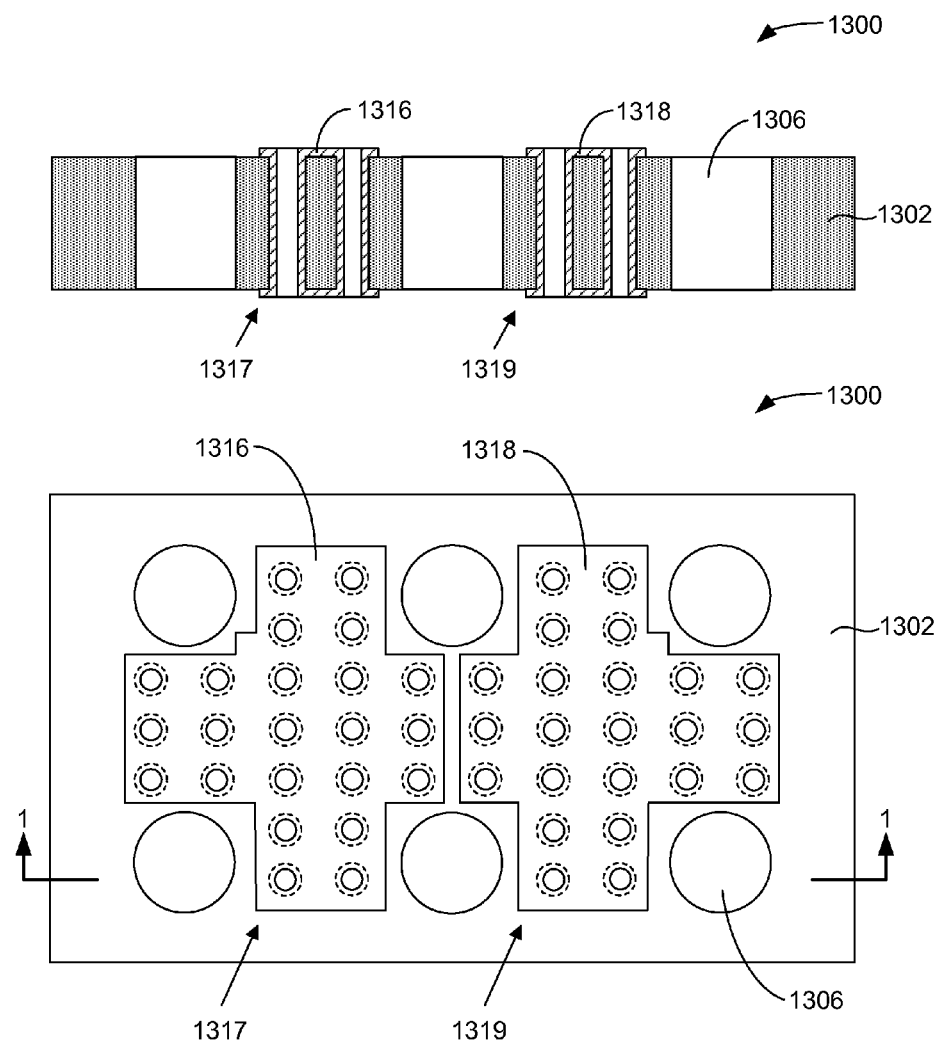

FIG. 13B shows examples of schematic illustrations of the partially fabricated glass interposer at this point (e.g., up through block 1204) in the process 1200. The glass interposer 1300 includes the glass substrate 1302 and a first electrode layer 1316 forming an electrode of a first MIM capacitor 1317 and the first electrode layer 1318 forming an electrode of a second MIM capacitor 1319. In some implementations, the first electrode layer may include Cu, a Cu alloy, Pd, Ag, Au, or another low resistivity metal. In some implementations, the first electrode layer may be about 0.5 microns to 20 microns thick.

Returning to FIG. 12, at block 1206, a dielectric layer is deposited on the first electrode layer. In some implementations, the dielectric layer may be deposited using a CVD process or an ALD process.

Figure 13C:
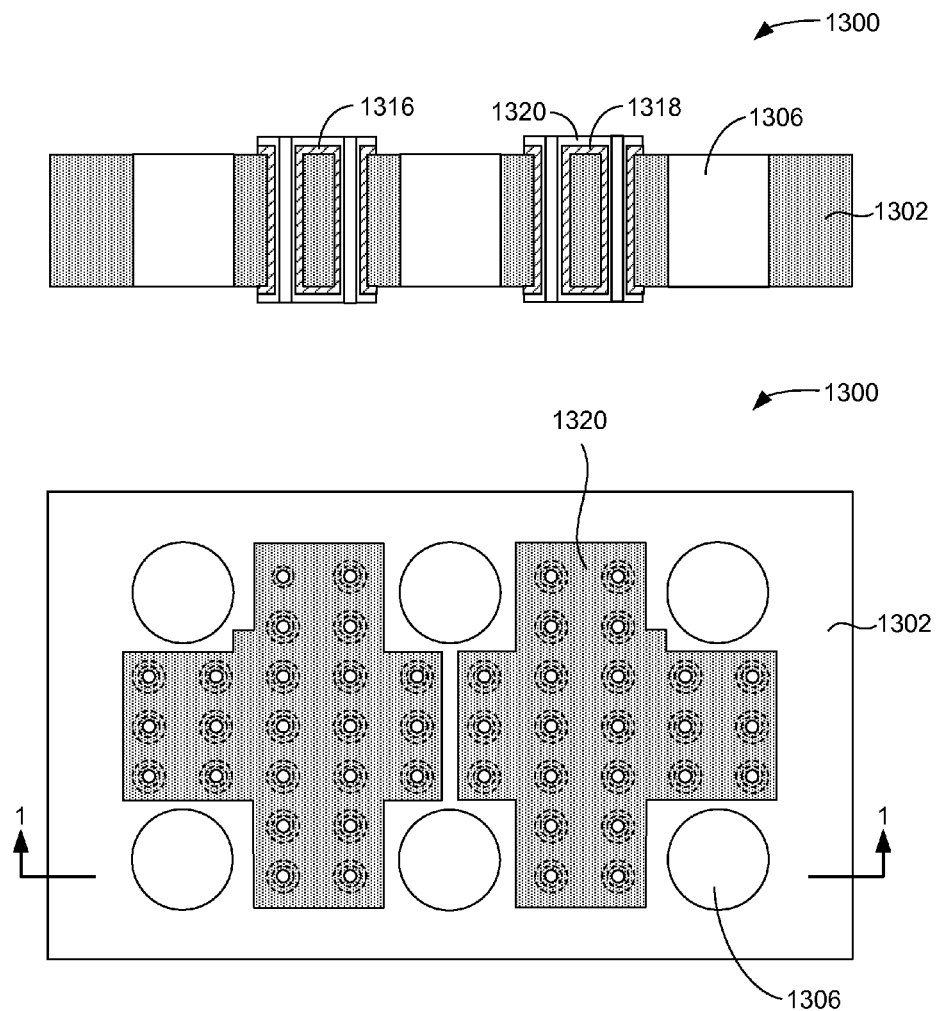

FIG. 13C shows examples of schematic illustrations of the partially fabricated glass interposer at this point (e.g., up through block 1206) in the process 1200. The glass interposer 1300 includes the glass substrate 1302, the first electrode layer 1316 and 1318, and a dielectric layer 1320. In some implementations, the dielectric layer may include $ZrO_2$, $Al_2O_3$, SrO, STO, $TiO_2$, combinations of layers of these different oxides, or other dielectrics. In some implementations, the dielectric layer may be about 4 nm to 100 nm thick, or about 10 nm to 35 nm thick.

Returning to FIG. 12, at block 1208 a second electrode layer is deposited on the dielectric layer. In some implementations, the second electrode layer may be deposited using a PVD process, a CVD process, or a plating process, as described above with respect to the first electrode layer. In some implementations, a dry film mask may be used to define the regions of the dielectric layer onto which the second electrode layer is deposited.

Figure 13D:
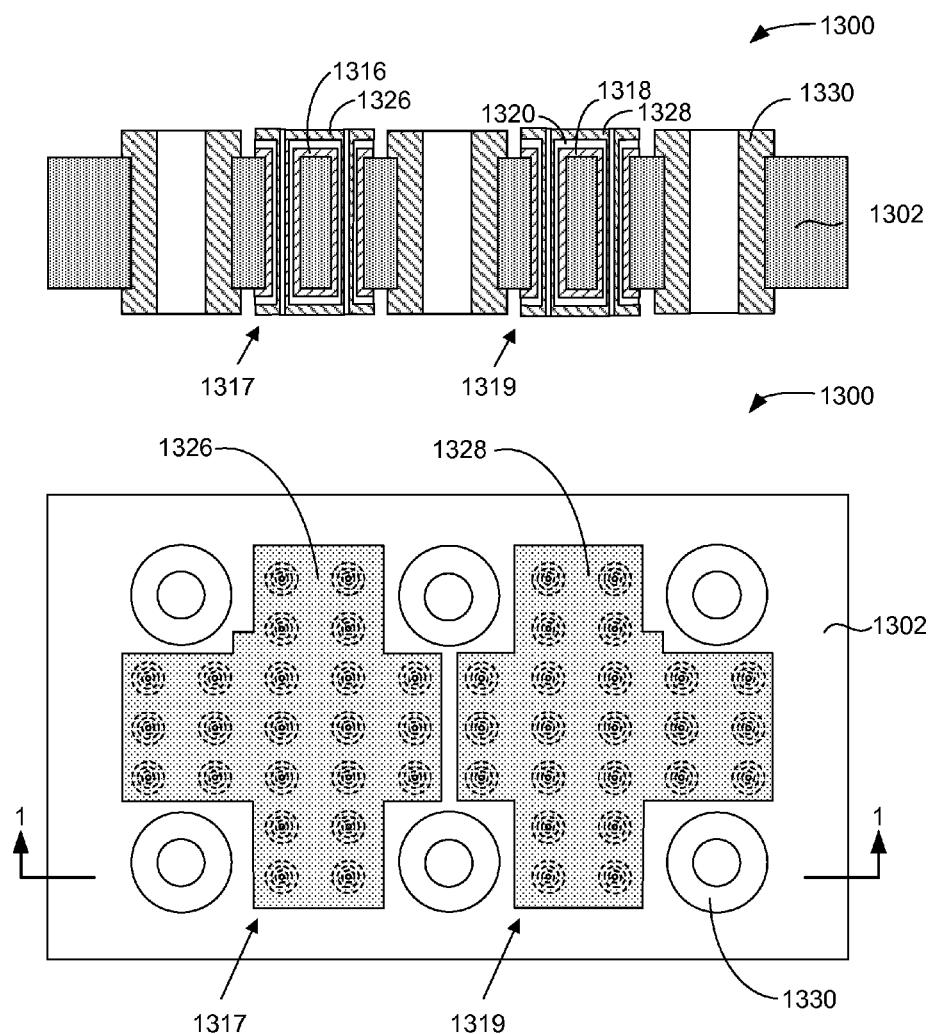

FIG. 13D shows examples of schematic illustrations of the partially fabricated glass interposer at this point (e.g., up through block 1208) in the process 1200. The glass interposer 1300 includes the glass substrate 1302, the first electrode layer 1316 and 1318, the dielectric layer 1320, and a second electrode layer 1326, 1328, and 1330. The second electrode layer 1326 may form an electrode of the first MIM capacitor 1317 and the second electrode layer 1328 may form an electrode of the second MIM capacitor 1319. The second electrode layer 1330 may form an interconnect associated with the through glass via 1306 of the glass interposer 1300. The dielectric layer 1320 may electrically isolate the first electrode layer 1316 from the second electrode layer 1326 of the first MIM capacitor 1317. Similarly, the dielectric layer 1320 may electrically isolate the first electrode layer 1318 from the second electrode layer 1328 of the second MIM capacitor 1919. In some implementations, the second electrode layers 1326 and 1328 may include Cu, a Cu alloy, Pd, Ag, Au, or another low resistivity metal. In some implementations, the second electrode layers 1326 and 1328 may be about 0.5 microns to 50 microns thick.

Returning to FIG. 12, at block 1210, a passivation layer is deposited. In some implementations, the passivation layer may be deposited with a PVD process, a CVD process, an ALD process, a spin-on process, an extrusion process, or a lamination process. In some implementations, the passivation layer may include a dielectric layer. For example, the passivation layer may include an oxide, such as $SiO_2$, or a polymer. In some implementations, the passivation layer may be about 0.2 microns to 100 microns thick.

Figure 13E:
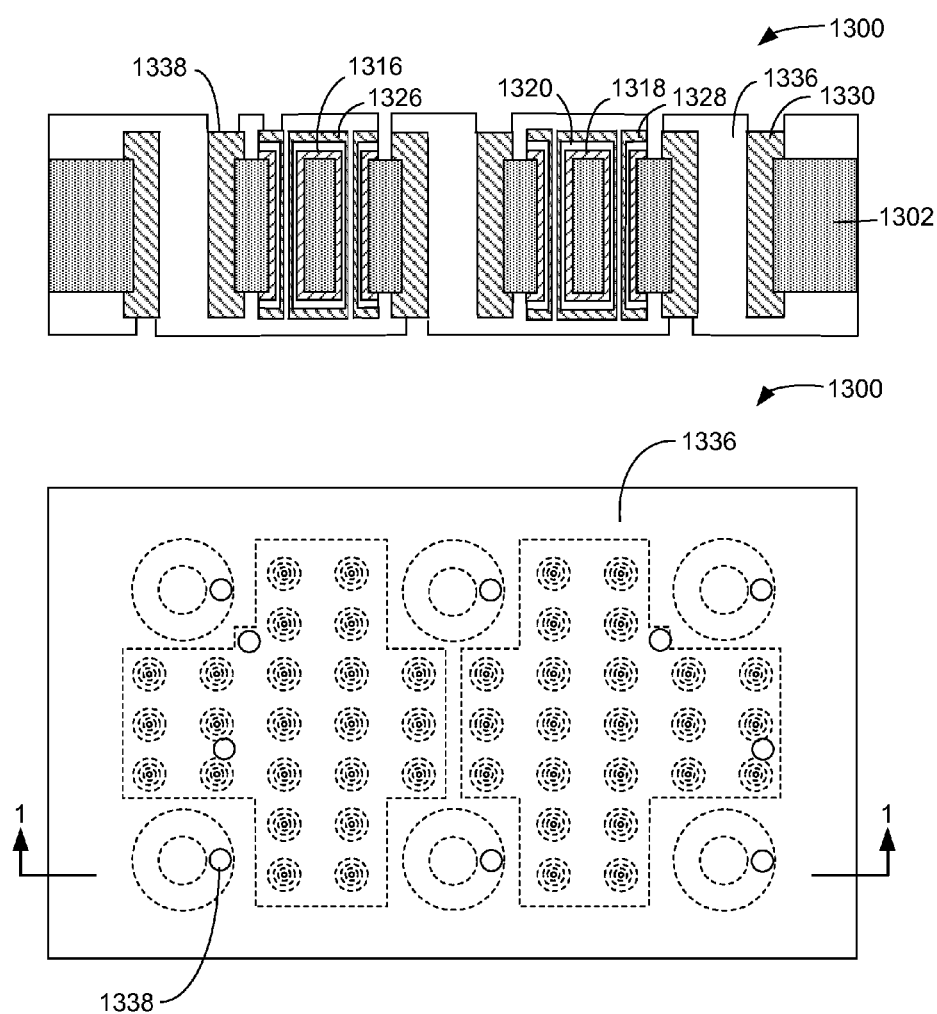

FIG. 13E shows examples of schematic illustrations of the partially fabricated glass interposer at this point (e.g., up through block 1210) in the process 1200. The glass interposer 1300 includes the glass substrate 1302, the first electrode layer 1316 and 1318, the dielectric layer 1320, the second electrode layer 1326, 1328, and 1330, and a passivation layer 1336. Some regions of the first electrode layer 1316 and 1318 and the second electrode layer 1326, 1328, and 1330 may not be covered with the passivation layer 1336 so that electrical contact may be made with the electrode layers. See, for example, region 1338 shown in FIG. 13E.

Returning to FIG. 12, at block 1212 interconnect pads are plated on the passivation layer. The interconnect pads may be used to provide electrical contact to the first electrode layers 1316 and 1318 and the second electrode layers 1326, 1328, and 1330 using the regions of the first electrode layers 1316 and 1318 and the second electrode layers 1326, 1328, and 1330 not covered with the passivation layer 1336.

In a plating process, a seed layer may first be deposited on surfaces of the partially fabricated glass interposer. In some implementations, the seed layer may be deposited using a CVD process, an ALD process, or an electroless plating process. In some implementations, the seed layer may include TiN, Ru—TiN, Pt, Pd, Au, Ag, Cu, Ni, Mo, or W. In some implementations, the seed layer may be about 25 nm to 500 nm thick. After the seed layer is deposited, in some implementations, a dry film mask may be used to define the regions of the partially fabricated glass interposer onto which the interconnect pads are plated. Then, the interconnect pads may be plated, with the seed layer acting as a nucleation site for the plating process. The plating process may be an electroless plating process or an electroplating process. A Cu—Ni—Al alloy, for example, may be plated onto the seed layer. In some implementations, the plated metal may not be the same metal as a metal of the seed layer. In some other implementations, the plated metal may be the same metal as a metal of the seed layer.

Figure 13F:
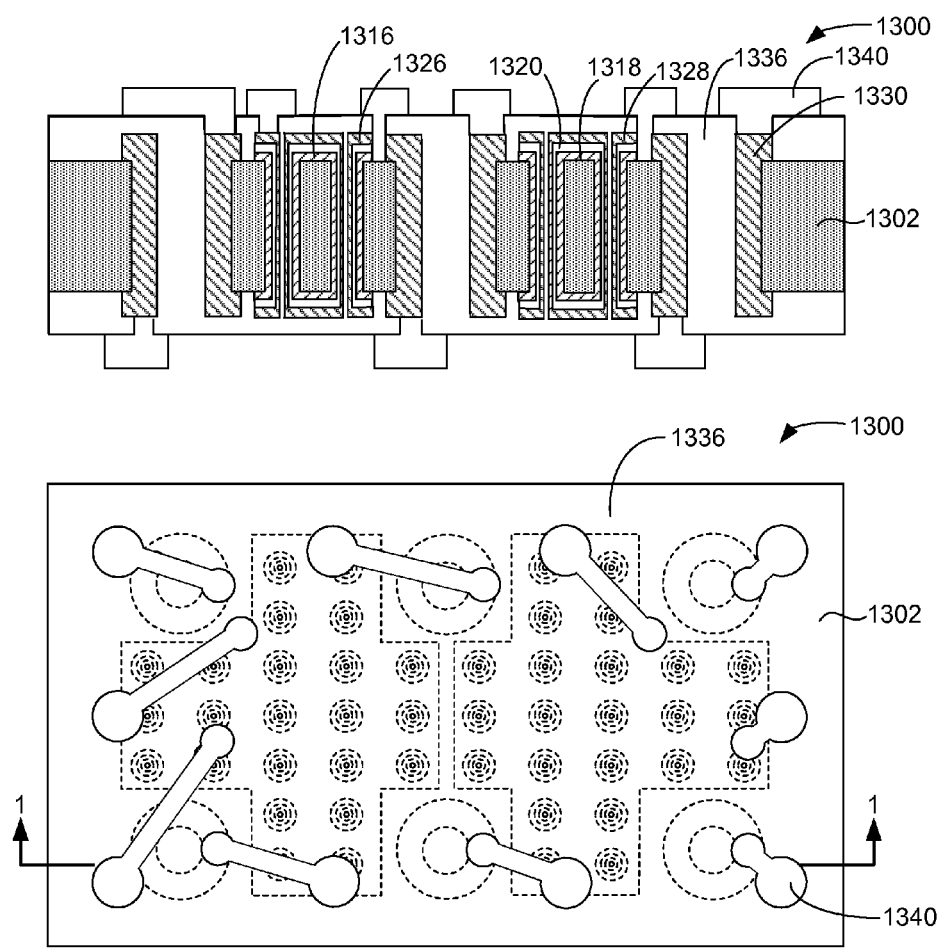
Figure 13G:
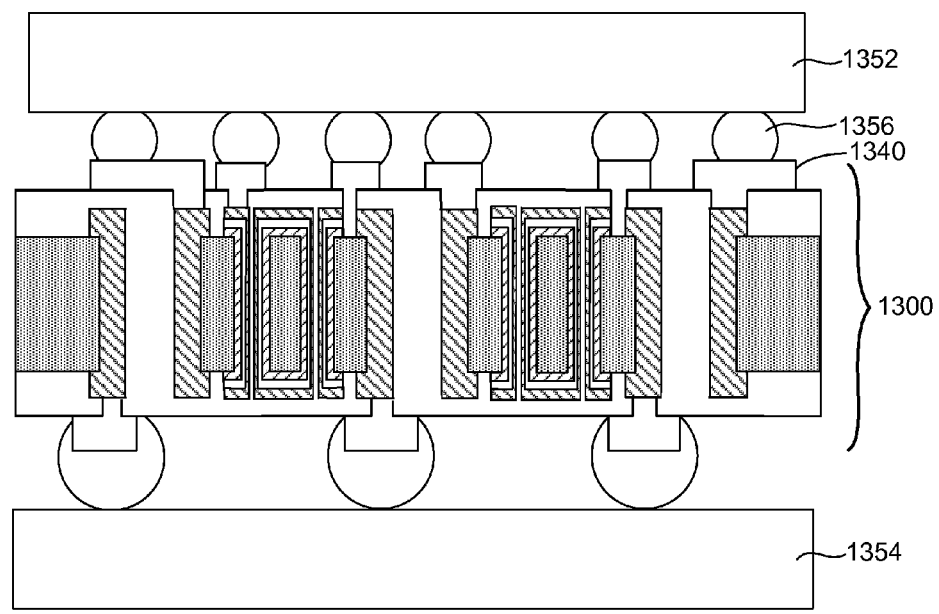
FIG. 13G shows an example of a cross-sectional schematic illustration of a glass interposer electrically connecting a first electronic component to a second electronic component.

FIG. 13F shows examples of schematic illustrations of the fabricated glass interposer at this point (e.g., up through block 1212) in the process 1200. The glass interposer 1300 includes the glass substrate 1302, the first electrode layers 1316 and 1318, the dielectric layer 1320, the second electrode layers 1326, 1328, and 1330, a passivation layer 1336, and an interconnect pad 1340. All of the regions of the first electrode layers 1316 and 1318 and the second electrode layers 1326, 1328, and 1330 not covered with the passivation layer 1336 may include an associated interconnect pad.

FIG. 13G shows an example of a cross-sectional schematic illustration of the glass interposer 1300 electrically connecting a first electronic component 1352 to a second electronic component 1354. For example, the first electronic component 1352 may be an integrated circuit or a silicon die and the second electronic component 1354 may be a printed circuit board, an organic substrate, or a ceramic substrate. In some implementations, the first electronic component 1352 may include two or more silicon dies. A solder ball 1356 of an appropriate solder metallurgy may be used to electrically connect, for example, the first electronic component 1352 to the interconnect pad 1340 of the glass interposer 1300. Similarly, solder balls may be used to connect other interconnect pads of the glass interposer 1300 to the first electronic component 1352 and to the second electronic component 1354. In some other implementations, a Cu pillar or rod though the glass substrate may electrically connect the first electronic component 1352 to the second electronic component 1354.

Additional configurations of the MIM capacitors disclosed herein are possible. For example, additional electrode layers and dielectric layers may be added to the MIM capacitors disclosed herein to further increase the capacitance density of the capacitor. Adding one additional dielectric layer and one additional electrode layer to a MIM capacitor may form a MIMIM capacitor, for example. A MIMIM capacitor may have twice the capacitance density compared to a similarly sized MIM capacitor.

Further, operations of the processes 900 and 1200 shown in FIGS. 9 and 12, respectively, may be combined and/or rearranged to form any of the MIM capacitors or other capacitors disclosed herein. For example, to fabricate a MIMIM capacitor, further metal deposition and dielectric deposition operations may be performed to form the additional electrode and dielectric layers in the MIMIM capacitor.

Figure 14A:
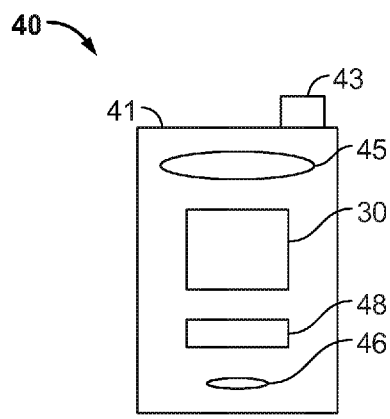
FIGS. 14A and 14B show examples of system block diagrams illustrating a display device that includes a plurality of interferometric modulators.
Figure 14B:
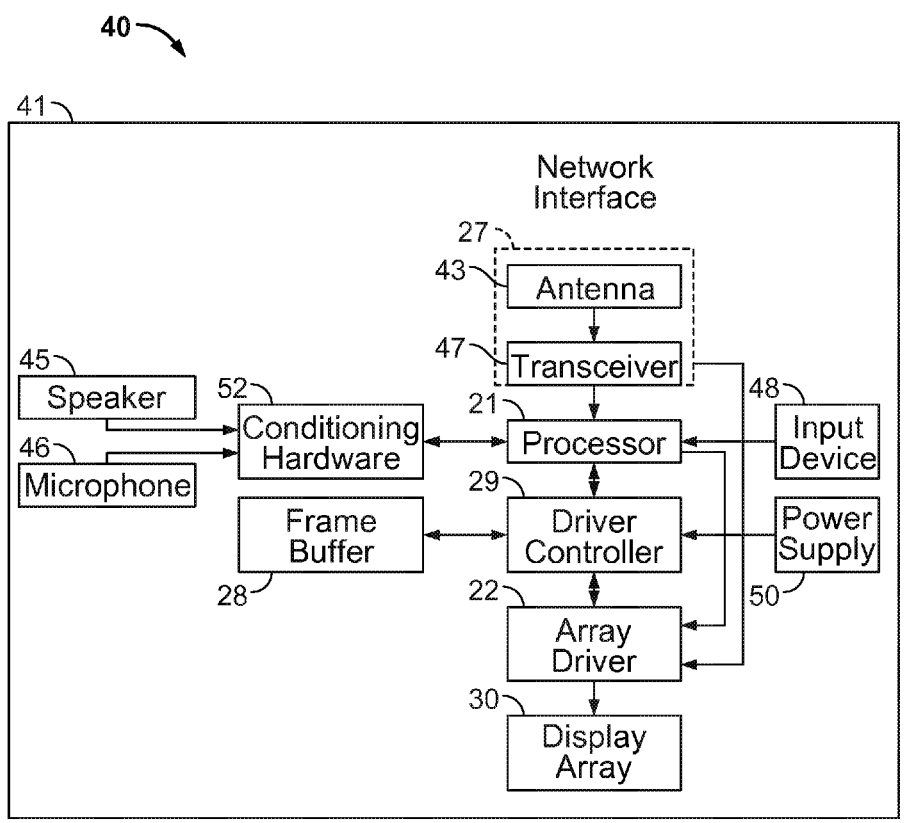

FIGS. 14A and 14B show examples of system block diagrams illustrating a display device 40 that includes a plurality of interferometric modulators. The display device 40 can be, for example, a smart phone, a cellular or mobile telephone. However, the same components of the display device 40 or slight variations thereof are also illustrative of various types of display devices such as televisions, tablets, e-readers, hand-held devices and portable media players.

The display device 40 includes a housing 41, a display 30, an antenna 43, a speaker 45, an input device 48 and a microphone 46. The housing 41 can be formed from any of a variety of manufacturing processes, including injection molding, and vacuum forming. In addition, the housing 41 may be made from any of a variety of materials, including, but not limited to: plastic, metal, glass, rubber and ceramic, or a combination thereof. The housing 41 can include removable portions (not shown) that may be interchanged with other removable portions of different color, or containing different logos, pictures, or symbols.

The display 30 may be any of a variety of displays, including a bi-stable or analog display, as described herein. The display 30 also can be configured to include a flat-panel display, such as plasma, EL, OLED, STN LCD, or TFT LCD, or a non-flat-panel display, such as a CRT or other tube device. In addition, the display 30 can include an interferometric modulator display, as described herein.

The components of the display device 40 are schematically illustrated in FIG. 14B. The display device 40 includes a housing 41 and can include additional components at least partially enclosed therein. For example, the display device 40 includes a network interface 27 that includes an antenna 43 which is coupled to a transceiver 47. The transceiver 47 is connected to a processor 21, which is connected to conditioning hardware 52. The conditioning hardware 52 may be configured to condition a signal (e.g., filter a signal). The conditioning hardware 52 is connected to a speaker 45 and a microphone 46. The processor 21 is also connected to an input device 48 and a driver controller 29. The driver controller 29 is coupled to a frame buffer 28, and to an array driver 22, which in turn is coupled to a display array 30. In some implementations, a power supply 50 can provide power to substantially all components in the particular display device 40 design.

The network interface 27 includes the antenna 43 and the transceiver 47 so that the display device 40 can communicate with one or more devices over a network. The network interface 27 also may have some processing capabilities to relieve, for example, data processing requirements of the processor 21. The antenna 43 can transmit and receive signals. In some implementations, the antenna 43 transmits and receives RF signals according to the IEEE 16.11 standard, including IEEE 16.11(a), (b), or (g), or the IEEE 802.11 standard, including IEEE 802.11a, b, g, n, and further implementations thereof. In some other implementations, the antenna 43 transmits and receives RF signals according to the BLUETOOTH standard. In the case of a cellular telephone, the antenna 43 is designed to receive code division multiple access (CDMA), frequency division multiple access (FDMA), time division multiple access (TDMA), Global System for Mobile communications (GSM), GSM/General Packet Radio Service (GPRS), Enhanced Data GSM Environment (EDGE), Terrestrial Trunked Radio (TETRA), Wideband-CDMA (W-CDMA), Evolution Data Optimized (EV-DO), 1×EV-DO, EV-DO Rev A, EV-DO Rev B, High Speed Packet Access (HSPA), High Speed Downlink Packet Access (HSDPA), High Speed Uplink Packet Access (HSUPA), Evolved High Speed Packet Access (HSPA+), Long Term Evolution (LTE), AMPS, or other known signals that are used to communicate within a wireless network, such as a system utilizing 3G or 4G technology. The transceiver 47 can pre-process the signals received from the antenna 43 so that they may be received by and further manipulated by the processor 21. The transceiver 47 also can process signals received from the processor 21 so that they may be transmitted from the display device 40 via the antenna 43.

In some implementations, the transceiver 47 can be replaced by a receiver. In addition, in some implementations, the network interface 27 can be replaced by an image source, which can store or generate image data to be sent to the processor 21. The processor 21 can control the overall operation of the display device 40. The processor 21 receives data, such as compressed image data from the network interface 27 or an image source, and processes the data into raw image data or into a format that is readily processed into raw image data. The processor 21 can send the processed data to the driver controller 29 or to the frame buffer 28 for storage. Raw data typically refers to the information that identifies the image characteristics at each location within an image. For example, such image characteristics can include color, saturation and gray-scale level.

The processor 21 can include a microcontroller, CPU, or logic unit to control operation of the display device 40. The conditioning hardware 52 may include amplifiers and filters for transmitting signals to the speaker 45, and for receiving signals from the microphone 46. The conditioning hardware 52 may be discrete components within the display device 40, or may be incorporated within the processor 21 or other components.

The driver controller 29 can take the raw image data generated by the processor 21 either directly from the processor 21 or from the frame buffer 28 and can re-format the raw image data appropriately for high speed transmission to the array driver 22. In some implementations, the driver controller 29 can re-format the raw image data into a data flow having a raster-like format, such that it has a time order suitable for scanning across the display array 30. Then the driver controller 29 sends the formatted information to the array driver 22. Although a driver controller 29, such as an LCD controller, is often associated with the system processor 21 as a stand-alone Integrated Circuit (IC), such controllers may be implemented in many ways. For example, controllers may be embedded in the processor 21 as hardware, embedded in the processor 21 as software, or fully integrated in hardware with the array driver 22.

The array driver 22 can receive the formatted information from the driver controller 29 and can re-format the video data into a parallel set of waveforms that are applied many times per second to the hundreds, and sometimes thousands (or more), of leads coming from the display's x-y matrix of pixels.

In some implementations, the driver controller 29, the array driver 22, and the display array 30 are appropriate for any of the types of displays described herein. For example, the driver controller 29 can be a conventional display controller or a bi-stable display controller (such as an IMOD controller). Additionally, the array driver 22 can be a conventional driver or a bi-stable display driver (such as an IMOD display driver). Moreover, the display array 30 can be a conventional display array or a bi-stable display array (such as a display including an array of IMODs). In some implementations, the driver controller 29 can be integrated with the array driver 22. Such an implementation can be useful in highly integrated systems, for example, mobile phones, portable-electronic devices, watches or small-area displays.

In some implementations, the input device 48 can be configured to allow, for example, a user to control the operation of the display device 40. The input device 48 can include a keypad, such as a QWERTY keyboard or a telephone keypad, a button, a switch, a rocker, a touch-sensitive screen, a touch-sensitive screen integrated with display array 30, or a pressure- or heat-sensitive membrane. The microphone 46 can be configured as an input device for the display device 40. In some implementations, voice commands through the microphone 46 can be used for controlling operations of the display device 40.

The power supply 50 can include a variety of energy storage devices. For example, the power supply 50 can be a rechargeable battery, such as a nickel-cadmium battery or a lithium-ion battery. In implementations using a rechargeable battery, the rechargeable battery may be chargeable using power coming from, for example, a wall socket or a photovoltaic device or array. Alternatively, the rechargeable battery can be wirelessly chargeable. The power supply 50 also can be a renewable energy source, a capacitor, or a solar cell, including a plastic solar cell or solar-cell paint. The power supply 50 also can be configured to receive power from a wall outlet.

In some implementations, control programmability resides in the driver controller 29 which can be located in several places in the electronic display system. In some other implementations, control programmability resides in the array driver 22. The above-described optimization may be implemented in any number of hardware and/or software components and in various configurations.

The various illustrative logics, logical blocks, modules, circuits and algorithm steps described in connection with the implementations disclosed herein may be implemented as electronic hardware, computer software, or combinations of both. The interchangeability of hardware and software has been described generally, in terms of functionality, and illustrated in the various illustrative components, blocks, modules, circuits and steps described above. Whether such functionality is implemented in hardware or software depends upon the particular application and design constraints imposed on the overall system.

The hardware and data processing apparatus used to implement the various illustrative logics, logical blocks, modules and circuits described in connection with the aspects disclosed herein may be implemented or performed with a general purpose single- or multi-chip processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, or, any conventional processor, controller, microcontroller, or state machine. A processor also may be implemented as a combination of computing devices, such as a combination of a DSP and a microprocessor, a plurality of microprocessors, one or more microprocessors in conjunction with a DSP core, or any other such configuration. In some implementations, particular steps and methods may be performed by circuitry that is specific to a given function.

In one or more aspects, the functions described may be implemented in hardware, digital electronic circuitry, computer software, firmware, including the structures disclosed in this specification and their structural equivalents thereof, or in any combination thereof. Implementations of the subject matter described in this specification also can be implemented as one or more computer programs, i.e., one or more modules of computer program instructions, encoded on a computer storage media for execution by, or to control the operation of, data processing apparatus.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein. The word "exemplary" is used exclusively herein to mean "serving as an example, instance, or illustration." Any implementation described herein as "exemplary" is not necessarily to be construed as preferred or advantageous over other possibilities or implementations. Additionally, a person having ordinary skill in the art will readily appreciate, the terms "upper" and "lower" are sometimes used for ease of describing the figures, and indicate relative positions corresponding to the orientation of the figure on a properly oriented page, and may not reflect the proper orientation of an IMOD as implemented.

Certain features that are described in this specification in the context of separate implementations also can be implemented in combination in a single implementation. Conversely, various features that are described in the context of a single implementation also can be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, a person having ordinary skill in the art will readily recognize that such operations need not be performed in the particular order shown or in sequential order, or that all illustrated operations be performed, to achieve desirable results. Further, the drawings may schematically depict one more example processes in the form of a flow diagram. However, other operations that are not depicted can be incorporated in the example processes that are schematically illustrated. For example, one or more additional operations can be performed before, after, simultaneously, or between any of the illustrated operations. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products. Additionally, other implementations are within the scope of the following claims. In some cases, the actions recited in the claims can be performed in a different order and still achieve desirable results.

What is claimed is:

1. An apparatus comprising:
   a glass substrate having a surface;
   a via extending at least partially through the glass substrate from the surface, the via having a depth to width aspect ratio of 10 to 1 or greater;
   a metal nitride layer on the surface of the glass substrate and on one or more interior surfaces of the via;
   a first electrode layer on the metal nitride layer, wherein the metal nitride layer serves as a seed layer for the first electrode layer;
   a dielectric layer over the first electrode layer; and
   a second electrode layer over the dielectric layer, wherein the first electrode layer, the dielectric layer, and the second electrode layer are part of a capacitive structure on the one or more interior surfaces of the via.

2. The apparatus of claim 1, wherein the metal nitride layer includes titanium nitride.

3. The apparatus of claim 1, wherein the via is a through-glass via extending through the glass substrate.

4. The apparatus of claim 1, wherein the via is a blind via extending only partially through the glass substrate.

5. The apparatus of claim 1, wherein the via has a width between about 2 microns and about 200 microns.

6. The apparatus of claim 1, the via has a depth between about 50 microns and about 1100 microns.

7. The apparatus of claim 1, wherein at least one of the first electrode layer and the second electrode layer includes copper (Cu).

8. The apparatus of claim 7, wherein the copper is one of electroless Cu and electroplated Cu.

9. The apparatus of claim 1, wherein the metal nitride layer has a thickness between about 25 nm and about 500 nm.

10. The apparatus of claim 1, wherein the dielectric layer includes at least one of zirconium oxide and aluminum oxide.

11. The apparatus of claim 1, wherein the dielectric layer has a thickness between about 4 nm and about 100 nm.

12. The apparatus of claim 1, further comprising:
    a non-oxidizing layer on the second electrode layer, wherein the non-oxidizing layer includes a metal nitride.

13. The apparatus of claim 1, further comprising:
    a non-oxidizing layer on the first electrode layer, wherein the non-oxidizing layer includes a metal nitride.

14. The apparatus of claim 1, wherein the second electrode layer substantially fills the via.

15. An apparatus comprising:
    a glass substrate having a surface;
    a via extending at least partially through the glass substrate from the surface, the via having a depth to width aspect ratio of 10 to 1 or greater;
    means for seeding a subsequent layer on the surface of the glass substrate and on one or more interior surfaces of the via, wherein the seeding means includes a metal nitride;
    first means for conducting electricity on the seeding means;
    means for electrically isolating the first conducting means and over the first conducting means; and
    second means for conducting electricity over the isolating means, wherein the first conducting means, the isolating means, and the second conducting means are part of a capacitive structure on the one or more interior surfaces of the via.

16. The apparatus of claim 15, wherein the metal nitride includes titanium nitride.

17. The apparatus of claim 15, wherein the via is a through-glass via extending through the glass substrate.

18. The apparatus of claim 15, wherein the via is a blind via extending only partially through the glass substrate.

19. The apparatus of claim 15, wherein at least one of the first conducting means and the second conducting means includes copper (Cu).

20. The apparatus of claim 15, further comprising:
    means for preventing oxidization on the second conducting means, wherein the preventing oxidation means include a metal nitride.

21. The apparatus of claim 15, further comprising:
    means for preventing oxidization on the first conducting means, wherein the preventing oxidation means include a metal nitride.

22. The apparatus of claim 15, wherein the second conducting means substantially fills the via.

23. A method comprising:
    providing a via through a glass substrate, the via having a depth to width aspect ratio of 10 to 1 or greater;
    depositing by atomic layer deposition (ALD) a metal nitride layer on a surface of the glass substrate and on one or more interior surfaces of the via;
    plating a first electrode layer on the metal nitride layer, wherein the metal nitride layer serves as a seed layer for the first electrode layer;
    depositing a dielectric layer over the first electrode layer; and
    plating a second electrode layer over the dielectric layer, wherein the first electrode layer, the dielectric layer, and the second electrode layer are part of a capacitive structure on the one or more interior surfaces of the via.

24. The method of claim 23, wherein the metal nitride layer includes titanium nitride.

25. The method of claim 23, wherein at least one of the first electrode layer and the second electrode layer includes copper (Cu).

26. The method of claim 23, further comprising:
depositing a non-oxidizing layer on the second electrode layer, wherein the non-oxidizing layer includes a metal nitride.

27. The method of claim 23, further comprising:
depositing a non-oxidizing layer on the first electrode layer, wherein the non-oxidizing layer includes a metal nitride.

28. The method of claim 23, wherein plating the second electrode layer includes substantially filling the via.

* * * * *